US006674131B2

(12) United States Patent
Yokogawa et al.

(10) Patent No.: US 6,674,131 B2
(45) Date of Patent: Jan. 6, 2004

(54) SEMICONDUCTOR POWER DEVICE FOR HIGH-TEMPERATURE APPLICATIONS

(75) Inventors: Toshiya Yokogawa, Nara (JP); Kunimasa Takahashi, Osaka (JP); Makoto Kitabatake, Nara (JP); Osamu Kusumoto, Nara (JP); Takeshi Uenoyama, Kyoto (JP); Koji Miyazaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/069,654

(22) PCT Filed: Jun. 27, 2001

(86) PCT No.: PCT/JP01/05535
§ 371 (c)(1),
(2), (4) Date: Feb. 26, 2002

(87) PCT Pub. No.: WO02/01641
PCT Pub. Date: Jan. 3, 2002

(65) Prior Publication Data
US 2003/0006415 A1 Jan. 9, 2003

(30) Foreign Application Priority Data
Jun. 27, 2000 (JP) ......................................... 2000-192182

(51) Int. Cl.[7] ....................... H01L 29/423; H01L 29/76; H01L 29/94; H01L 31/062; H01L 31/113; H01L 31/119; H01L 27/095; H01L 29/00; H01L 21/00
(52) U.S. Cl. ..................................................................
(52) U.S. Cl. ................................. 1p;2p257/379; 257/124; 257/476; 257/516; 257/528; 257/531; 257/532; 438/105; 438/931; 438/957

(58) Field of Search ................................. 257/385, 394, 257/395, 344, 408, 68, 69, 71, 296, 300, 336, 316, 339, 119, 124, 133, 146, 155, 277, 278, 306, 368, 379, 476, 486, 499, 504, 506, 516, 528, 531, 532, 545, 551; 438/105, 931, 957

(56) References Cited
U.S. PATENT DOCUMENTS

| 5,488,237 A | | 1/1996 | Kuwata | 257/194 |
|---|---|---|---|---|
| 5,977,564 A | * | 11/1999 | Kobayashi et al. | 257/77 |
| 6,380,569 B1 | * | 4/2002 | Chang et al. | 257/256 |

FOREIGN PATENT DOCUMENTS
EP 0 555 886 A2 8/1993 ......... H01L/29/812

(List continued on next page.)

OTHER PUBLICATIONS

International Search Report—PCT/JP01/05535, Japanese Patent Office, Sep. 25, 2001.

*Primary Examiner*—Nathan J. Flynn
*Assistant Examiner*—Victor A. Mandala, Jr.
(74) *Attorney, Agent, or Firm*—Harness, Dickey & Pierce, P.L.C.

(57) ABSTRACT

In a SiC substrate (10), a first active region (12) composed of n-type heavily doped layers (12a) and undoped layers (12b), which are alternately stacked, and a second active region (13) composed of p-type heavily doped layers (13a) and undoped layers (13b), which are alternately stacked, are provided upwardly in this order. A Schottky diode (20) and a pMOSFET (30) are provided on the first active region (12). An nMOSFET (40), a capacitor (50), and an inductor (60) are provided on the second active region (13). The Schottky diode (20) and the MOSFETs (30, 40) have a breakdown voltage characteristic and a carrier flow characteristic due to a multilayer structure composed of δ-doped layers and undoped layers and are integrated in a common substrate.

4 Claims, 18 Drawing Sheets

FOREIGN PATENT DOCUMENTS

| | | |
|---|---|---|
| JP | 61-27681 | 2/1986 |
| JP | 62-42566 | 2/1987 |
| JP | 62-51265 | 3/1987 |
| JP | 2-111073 | 4/1990 |
| JP | 4-207040 | 7/1992 |
| JP | 4-290212 | 10/1992 |
| JP | 5-160344 | 6/1993 |
| JP | 6-275786 | * 9/1994 ...... 27/8 |
| JP | 8-195287 | * 7/1996 ...... 41/24 |
| JP | 8-222695 | 8/1996 |
| JP | 9-246471 | 9/1997 |
| JP | 10-92947 | 4/1998 |
| JP | 10-289979 | 10/1998 |

\* cited by examiner

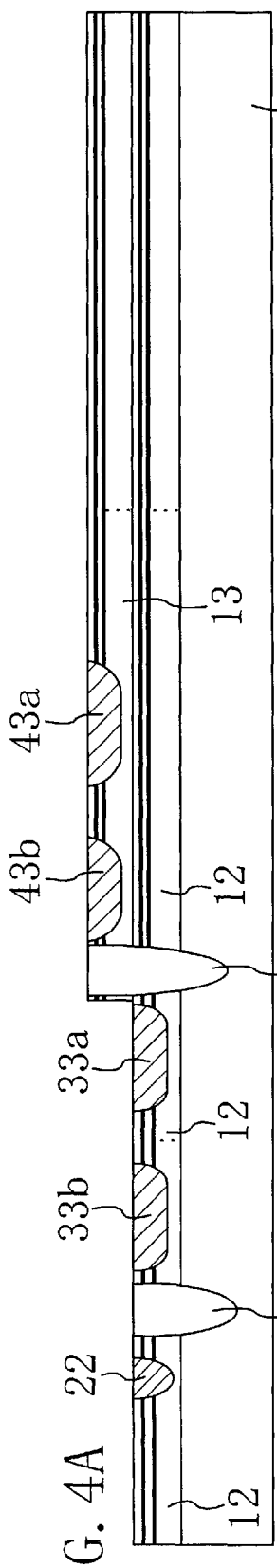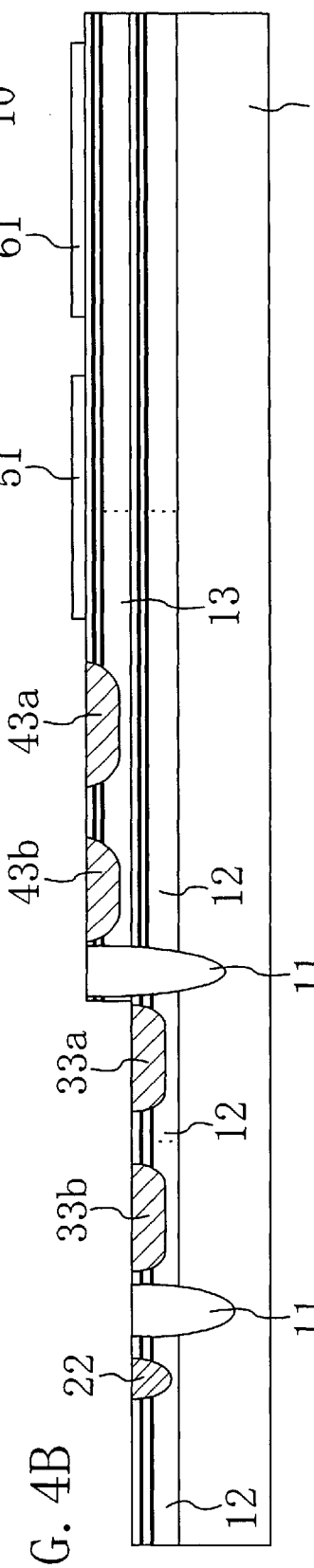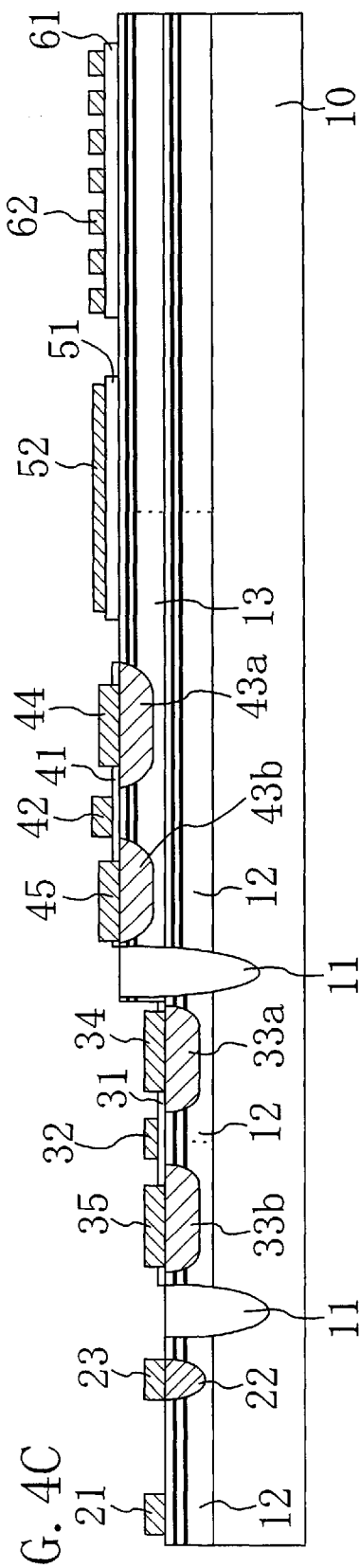

SEMICONDUCTOR POWER DEVICE FOR HIGH-TEMPERATURE APPLICATIONS

TECHNICAL FIELD

The present invention relates to a semiconductor power device for use in high-temperature applications requiring a high breakdown voltage and a large current, which is suited to high-power-consumption equipment such as a lighting device or an air conditioner.

BACKGROUND ART

Silicon carbide (SiC) is a semiconductor having a band gap larger than that of silicon (Si) and therefore high dielectric resistance. Since silicon carbide retains stability at high temperatures, a semiconductor device formed by using a SiC substrate is expected to be applied to a next-generation power device or high-temperature operating device. In general, a power device is a generic name for a device which converts or controls high power and is termed a power diode, a power transistor, or the like. Exemplary applications of the power device include a transistor and a diode disposed in the inverter control unit of such equipment as a vacuum cleaner, a laundry washer, a refrigerator, a fluorescent lamp, or an air conditioner. The applications of the power device is expected to be widened in the future.

For these applications, a plurality of semiconductor chips are typically connected with wires in accordance with a use and an object and placed in a single package to provide a modular structure. For example, a desired circuit is constructed with semiconductor chips and wires by forming the wires on a substrate such that a circuit suitable for the use is constructed and mounting the individual semiconductor chips on the substrate. As a conventional example of a semiconductor power device circuit, a description will be given to an inverter circuit for a fluorescent lamp using a Schottky diode and a MOS field effect transistor.

FIG. 18 is a cross-sectional view showing a structure of a conventional fluorescent bulb lamp device 250 disclosed in PCT Application No. JP00/02054. As shown in the drawing, the fluorescent lamp device 250 comprises: a fluorescent lamp 201 composed of three luminescent tubes each having a generally U-shaped configuration which are coupled to each other with bridges; a lighting circuit 202 including such an element as a semiconductor chip for lighting the fluorescent lamp 201; a cover 203 for containing the lighting circuit 202; a mouth ring 204 attached to a tip of the cover 203; and a globe 205 enveloping the fluorescent lamp 201.

FIG. 19 is an electric circuit diagram showing a structure of the lighting circuit 202 in the fluorescent lamp device 250. As shown in the drawing, the lighting circuit 202 is composed of a line filter circuit 212, a rectifying circuit 213, a power-supply smoothing capacitor 214, an inverter circuit 215, a choke coil 207, and a resonating capacitor 216 which are disposed in the lighting circuit 202. The inverter circuit 215 is composed of an inverter driving IC 217, FETs 208 and 209 which are switching elements driven by the inverter driving IC 217, and a capacitor 218 for inverter. The fluorescent lamp 201 is disposed in parallel with the resonating capacitor 216 such that fluorescent light is emitted therefrom by allowing a discharge current to flow between electrodes 221 and 222 at both ends in the fluorescent lamp 201.

In the conventional fluorescent lamp device 250, the individual circuits are formed as discrete external components and then the line filter circuit 212, the power-supply smoothing capacitor 214, the choke coil 207, the resonating capacitor 216, the capacitor 218 for inverter, and the like are disposed on a top surface 206a of a circuit board 206, while the rectifying circuit 213, the inverter driving IC 217, the FETs 208 and 209, and the like are disposed on a back surface 206b of the circuit board 206. In short, components having relatively low heat resistance such as the rectifying circuit 213, the inverter driving IC 217, and the FETs 208 and 209 in the inverter circuit 215 are disposed on the surface different from the surface on which the choke coil 207 as a heat generating component and the like are disposed in spaced apart relation therefrom.

Since the current flowing in the electrodes 221 and 222 of the fluorescent lamp 202 is large to impart sufficient brightness to the lamp, a pMOSFET and an nMOSFET as power transistors are used as the FETs 208 and 209 disposed in the inverter circuit 215. On the other hand, a power diode is used as the diode disposed in the rectifying circuit 213. The basic function of the power device including the power transistor and the power diode is equivalent to that of an AC-DC-AC converter for converting 50/60 Hz to, e.g., 50 kHz. As such a power transistor or a power diode, a power device provided on a SiC substrate as described above is adopted oftentimes.

Problems to be Solved

However, the foregoing conventional fluorescent lamp device has the following problems.

In the conventional fluorescent lamp device 250, solder or the like is used normally to mount the transistor, diode, and the like on the substrate. However, the transistor, the diode, and the like cannot be positioned adjacent, e.g., a fluorescent lamp which generates a large amount of heat since the solder lacks durability at high temperatures. As a result, the whole fluorescent lamp system is increased disadvantageously in size.

In the lighting circuit 202 formed by mounting the individual components on the circuit board 206 and providing connections therebetween with wires, stringent positional restrictions are placed on the components with low heat resistance to circumvent a temperature increase. As a result, the whole lighting circuit 201 is inevitably increased disadvantageously in size in spite of various considerations given to the positional relations among the individual components.

By using the high heat resistance of a SiC substrate, a semiconductor device provided on the SiC substrate may be placed in equipment used in a high-temperature environment such as the lighting circuit. However, since the power transistor and power diode provided on the conventional SiC substrate are discrete devices, it is difficult to prevent the lighting circuit 202 from being increased in size.

It is therefore an object of the present invention to provide a semiconductor device to be placed suitably under stringent conditions including limited operating temperatures and limited space by providing at least either of active elements and passive elements on a compound semiconductor substrate with high heat resistance.

Disclosure of the Invention

A first semiconductor device according to the present invention comprises: a compound semiconductor layer provided in a substrate; an active region provided on the compound semiconductor layer and composed of at least one first semiconductor layer functioning as a carrier flow region and at least one second semiconductor layer containing an impurity for carriers at a high concentration and smaller in film thickness than the first semiconductor layer such that the carriers are distributed therein under a quantum effect, the first and second semiconductor layers being alternately stacked; and a plurality of active elements provided on the active region.

In the arrangement, if a voltage which brings the active elements into the ON state is applied, the carriers in the second semiconductor layer spread out extensively to the first semiconductor layer so that the carriers are distributed in the entire active region. Because of a low impurity concentration in the first semiconductor layer, scattering of the carriers by impurity ions is reduced in the first semiconductor layer. If a MISFET and a diode are provided on the active region, therefore, carriers flow at a particularly high speed. Moreover, the whole active region is depleted in the OFF state irrespective of an average impurity concentration which is not low in the active region so that the carriers no more exist in the active region. Consequently, the breakdown voltage is defined by the first semiconductor layer at a low impurity concentration so that a high breakdown voltage is obtained in the entire active region.

Since the high-performance active elements integrated in the compound semiconductor layer are obtainable, the semiconductor device can be placed at a desired site without using solder even if the semiconductor device is used at high temperature. This improves the flexibility with which the semiconductor device is placed in equipment and allows the scaling down of the equipment using the semiconductor device.

Each of the plurality of active elements includes a MISFET having the first semiconductor layer located immediately under a gate insulating film. In the arrangement, the low impurity concentration in the first semiconductor layer reduces the number of charges trapped in the gate insulating film of a MISFET and in the vicinity of the interface between the gate insulating film and the active region and lessens the interrupting effect exerted by the trapped charges on the flowing carriers. What results is an integrated semiconductor device having a MISFET with a higher channel mobility.

The first semiconductor device comprises, as the active region, a first active region containing an impurity of a first conductivity type as the impurity for carriers in the second semiconductor layer and a second active region formed on the first active region and containing an impurity of a second conductivity type as the impurity for carriers in the second semiconductor layer, wherein the first active region is exposed at an uppermost layer of the substrate as a result of partly removing the second active region and a MISFET of the second conductivity type is provided at a portion at which the first active region is exposed, while a MISFET of the first conductivity type is provided on the second active region. The arrangement provides a semiconductor device functioning as a CMOS device comprising a pMOSFET and an nMOSFET.

The compound semiconductor layer is a semiconductor layer selected from the group consisting of a SiC layer, a GaN layer, an InP layer, an InGaAs layer, and an InGaPN layer. By using the characteristics of the compound semiconductor layers, a semiconductor device having particularly high heat resistance and a high breakdown voltage is obtained.

A second semiconductor device according to the present invention comprises: a semiconductor layer selected from the group consisting of a SiC layer, a GaN layer, an InP layer, an InGaAs layer, and an InGaPN layer; and an inductor provided on the semiconductor layer. By using the high heat resistance and high heat conductivity of the SiC layer, the GaN layer, the InP layer, the InGaAs layer, or the InGaPN layer, an inductor having an extremely fine pattern can be provided and an inductor having a small area and high inductance can be provided.

The semiconductor layer is composed of at least one first semiconductor layer functioning as a carrier flow region and at least one second semiconductor layer containing an impurity for carriers at a high concentration and smaller in film thickness than the first semiconductor layer such that the carriers are distributed therein under a quantum effect, the first and second semiconductor layers being alternately stacked, the device further comprising a plurality of active elements provided on the semiconductor layer. The arrangement provides a high-performance semiconductor device having the first semiconductor device provided on the semiconductor layer.

The second semiconductor device further comprises: a circuit including a MISFET provided on the semiconductor layer; a rectifying circuit including a Schottky diode provided on the semiconductor device; and a capacitor provided on the semiconductor layer, the device functioning as a lighting circuit for a fluorescent lamp device. The arrangement allows a semiconductor device miniaturized considerably and integrated in a common substrate to be placed in the high-temperature and limited space of a fluorescent lamp.

BRIEF DESCRIPTION OF THE DRAWINGS

FIGS. 4A, 4B, and 4C are cross-sectional views illustrating the process steps of fabricating the semiconductor device according to the first embodiment from the formation of source/drain regions to the formation of the electrode or conductor film of each of elements;

BEST MODES FOR CARRYING OUT THE INVENTION

A description will be given herein below to the embodiments of the present invention.

Embodiment 1

Figure 1:
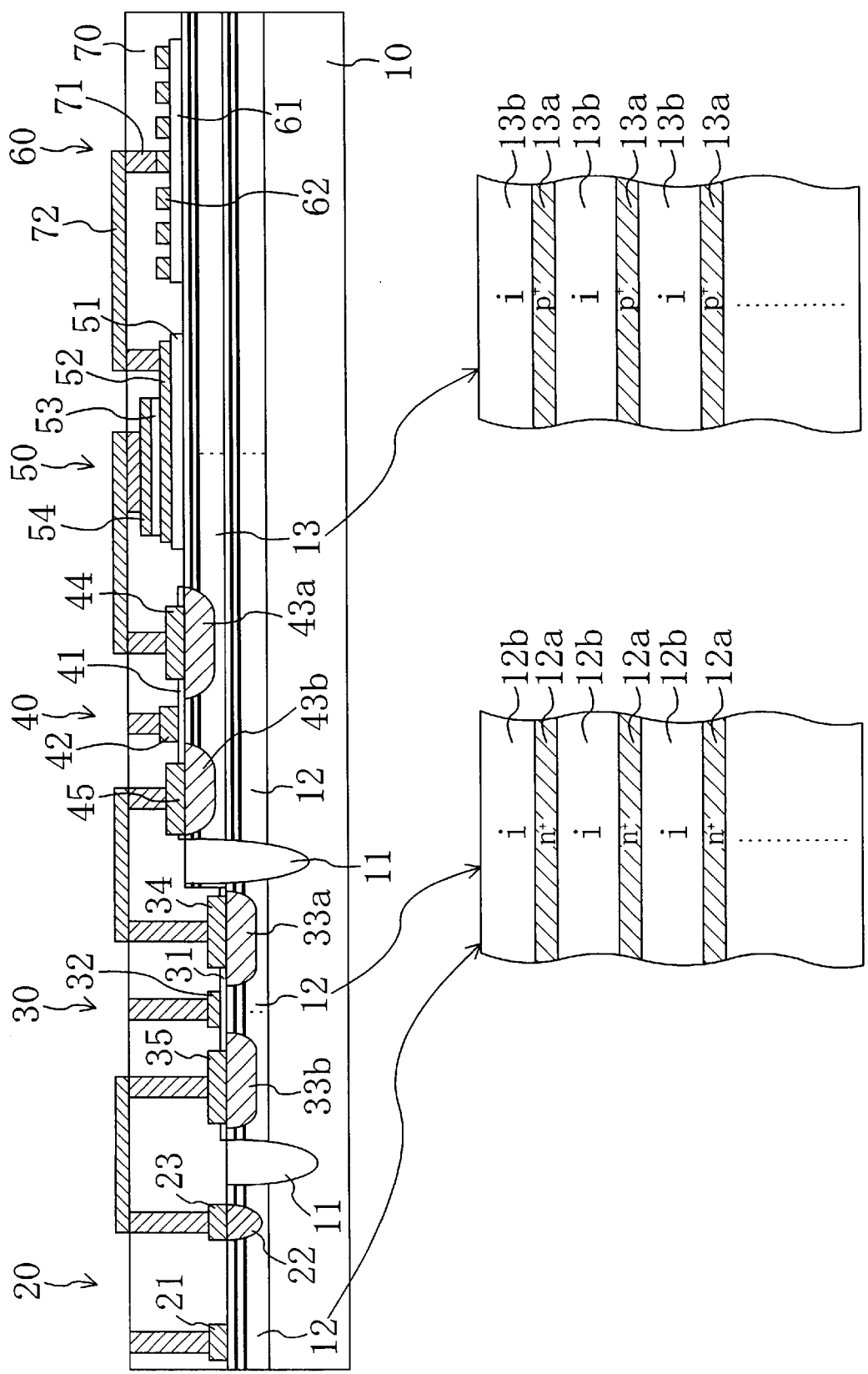
FIG. 1 is a cross-sectional view of a semiconductor device composed of a Schottky diode, a MOSFET, a capacitor, and an inductor integrated in a SiC substrate according to a first embodiment of the present invention.

FIG. 1 is a cross-sectional view of an integrated semiconductor device composed of a Schottky diode, a MOSFET, a capacitor, and an inductor which are integrated in a SiC substrate according to a first embodiment of the present invention.

In a SiC substrate 10 which is a 4H—SiC substrate, an n-type first active region 12 doped with nitrogen at an average concentration of about $1 \times 10^{17}$ atoms $cm^{-3}$, a p-type second active region 13 doped with aluminum at an average concentration of about $1 \times 10^{17}$ atoms $cm^{-3}$ are provided upwardly in this order. The second active region 13 is partly removed such that the first active region 12 is partly exposed at the substrate. Insulation regions 11 each composed of a silicon dioxide film buried in a trench, which is for dividing the active regions 12 and 13 on a per element basis, are also provided in the SiC substrate 10.

As shown in the lower part of FIG. 1 under magnification, the first active region 12 consists of twenty n-type doped layers 12a each containing nitrogen at a high concentration (e.g., $1 \times 10^{18}$ atoms $cm^{-3}$) and having a thickness of about 10 nm and twenty undoped layers 12b each composed of an undoped 4H—SiC single crystal and having a thickness of about 50 nm, which are alternately stacked. On the other hand, the second active region 13 consists of twenty p-type doped layers 13a each containing aluminum at a high concentration (e.g., $1 \times 10^{18}$ atoms $cm^{-3}$) and having a thickness of about 10 nm and twenty undoped layers 13b each composed of an undoped 4H—SiC single crystal and having a thickness of about 50 nm, which are alternately stacked. Each of the n-type doped layers 12a and the p-type doped layers 13a is formed sufficiently thin to allow spreading movement of carriers to the undoped layers 12b and 13b under a quantum effect.

A Schottky diode 20 (rectifying element) and a pMOSFET 30 (switching element) are provided on the portion of the SiC substrate 10 at which the first active region 12 is exposed, while an nMOSFET 40 (switching element), a capacitor 50 (capacitive element), and an inductor 60 (inductive element) are provided on the portion of the SiC substrate 10 having the second active region 13 located in the upper portion thereof.

The Schottky diodes 20 comprises: a Schottky electrode 21 composed of nickel (Ni) in Schottky contact with the first active region 12; an electrode withdrawn layer 22 formed by implanting nitrogen at a high concentration (e.g., $1 \times 10^{18}$ atoms $cm^{-3}$) in the first active region 12; and an ohmic electrode 23 composed of nickel (Ni) in ohmic contact with the electrode withdrawn electrode 22.

The pMOSFET 30 comprises: a gate insulating film 31 composed of $SiO_2$ formed on the first active region 12; a gate electrode 32 composed of a Ni alloy film formed on the gate insulating film 31; p-type source and drain regions 33a and 33b formed by implanting aluminum at a concentration of $1 \times 10^{18}$ atoms $cm^{-3}$ in the regions of the first active region 12 located on both sides of the gate electrode 32; and source and drain electrodes 34 and 35 composed of a Ni alloy film in ohmic contact with the source and drain regions 33a and 33b, respectively.

The nMOSFET 40 comprises: a gate insulating film 41 composed of $SiO_2$ formed on the second active region 13; a gate electrode 42 composed of a Ni alloy film formed on the gate insulating film 41; n-type source and drain regions 43a and 43b formed by implanting nitrogen at a concentration of $1 \times 10^{18}$ atoms $cm^{-3}$ in the regions of the second active region 13 located on both sides of the gate electrode 42; and source and drain electrodes 44 and 45 composed of a Ni alloy film in ohmic contact with the source and drain regions 43a and 43b, respectively.

The capacitor 50 comprises: an underlying insulating film 51 composed of a SiN film provided on the second active region 13; a lower electrode 52 composed of a platinum (Pt) film provided on the underlying insulating film 51; a capacitor insulating film 53 composed of a film of a high dielectric material such as BST provided on the lower electrode 52; and an upper electrode 54 composed of a platinum (Pt) film opposed to the lower electrode 52 with the capacitor insulating film 53 interposed therebetween.

The inductor 60 comprises: a dielectric film 61 composed of a SiN film provided on the first active region 12; and a conductor film 62 composed of a spiral Cu film formed on the dielectric film 61. The conductor film 62 has a width of about 9 μm and a thickness of about 4 μm. The spacing between the conductor films 62 is about 4 μm. However, since the SiC substrate 10 has high heat resistance and a high heat conductivity, the conductor film 62 can be scaled down to a smaller pattern depending on an amount of current. For example, a configuration with a width of about 1 to 2 μm and a spacing of about 1 to 2 μm can be formed.

An interlayer insulating film 70 composed of a silicon dioxide film is also formed on the substrate Wires 72 composed of an aluminum alloy film, a Cu alloy film, or the like are provided on the interlayer insulating film 70. The elements 20, 30, 40, 50, and 60 have respective conductor portions connected to the wires 72 via contacts 71 composed of an aluminum alloy film or the like buried in contact holes formed in the interlayer insulating film 70.

Figure 2:
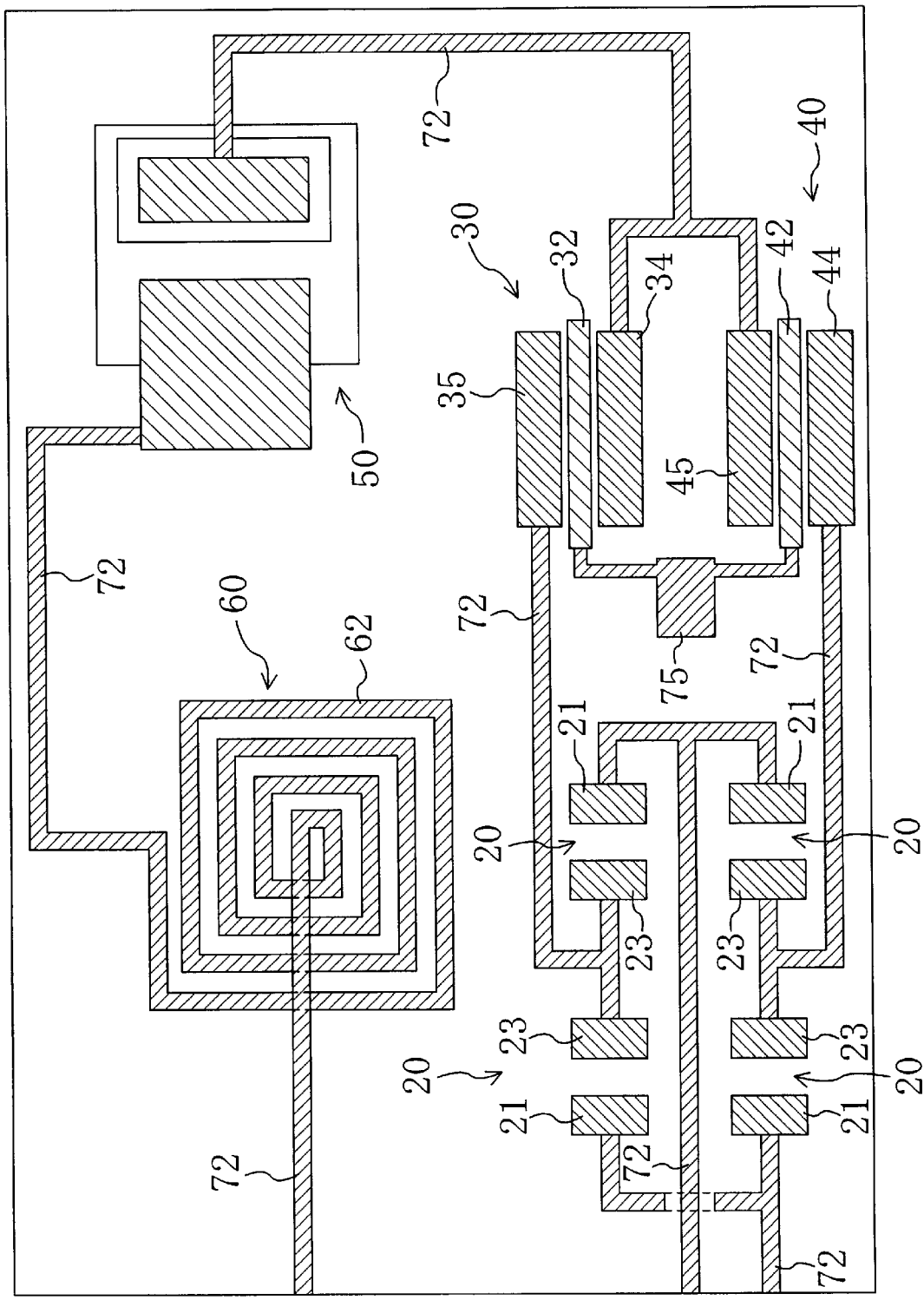
FIG. 2 is a plan view schematically showing a two-dimensional pattern of the semiconductor device according to the first embodiment.
Figure 19:
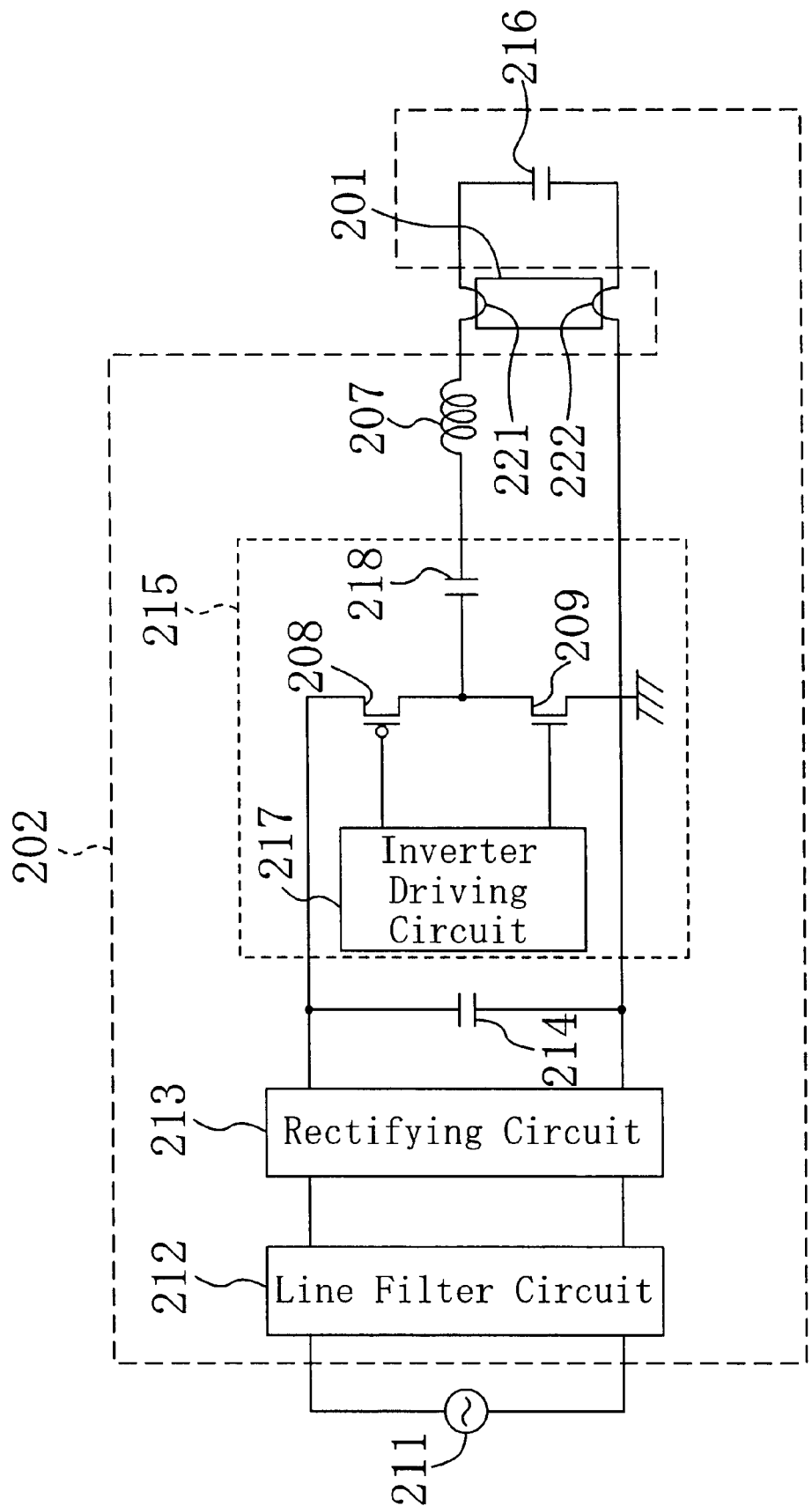
FIG. 19 is an electric circuit diagram showing a structure of the lighting circuit in the conventional fluorescent lamp device.

FIG. 2 is a plan view schematically showing a two-dimensional pattern of the semiconductor device according to the present embodiment. As shown in the drawing, the rectifying circuit including the four Schottky diodes 20, an inverter circuit including the pMOSFET 30 and the nMOSFET 40, the capacitor 50, and the inductor 60 are connected with the wires 72. The semiconductor device is constructed such that a control signal is inputted via a pad 75 to each of the gate electrodes 32 and 42 of the pMOSFET 30 and nMOSFET 40 of the inverter circuit. It is also possible to place a smoothing capacitor (corresponding to the capacitor 214 shown in FIG. 19) between the rectifying circuit and the inverter circuit.

Since the Schottky diode 20, the pMOSFET 30, the nMOSFET 40, the capacitor 50, and the inductor 60 are integrated in the common SiC substrate 10, the semiconductor device according to the present embodiment has the characteristics of high power and high breakdown voltage so that a semiconductor device suited to such equipment as a vacuum cleaner, a laundry washer, a refrigerator, a fluorescent lamp, an air conditioner, or the like is provided. By mounting the inductor 60, which has conventionally been mounted externally by using solder or the like, on the SiC substrate 10 in conjunction with the other elements, in particular, the semiconductor device can be placed flexibly without temperature constraints. The integration of the large number of elements in the common SiC substrate saves the labor of assembling the components and thus reduces a fabrication cost for the semiconductor device. An element having an active region composed of δ-doped layers and lightly doped layers in stacked relation was proved to increase the production yield as well so that a cost reduction is achievable by the increased production yield.

If the semiconductor device is applied to equipment handling an RF signal on the GHz order, in particular, the dielectric film 61 of the inductor 60 is preferably composed of a BCB (benzocyclobutene) film. The BCB film is a film containing BCB in the structure thereof, which is obtained by dissolving a BCB-DVS monomer in a solvent, applying the resulting solution, and baking the applied solution. The BCB film features a relative dielectric constant as low as about 2.7 and easy formation of a film as thick as about 30 $\mu$m by a single step of application. Since the tan δ of the BCB film is about 0.006 at 60 GHz, which is lower than that of $SiO_2$ by one order of magnitude, the BCB film has particularly excellent characteristics as the dielectric film composing the inductor and a microstrip line.

Since the present embodiment has provided the SiC substrate 10 with the first and second active regions 12 and 13 having the structure shown in the lower part of FIG. 1, the following prominent effects can be exerted by the individual elements.

If a forward bias is applied to the Schottky diode 20, the potential of the first active region 12 is increased to elevate an energy level at a conduction band edge in each of the n-type doped layers 12a and the undoped layers 12b. Since carriers in the n-type doped layer 12a spread out even to the undoped layer 12b under a quantum effect, a current easily flows in the Schottky electrode 21 through each of the n-type doped layers 12a and undoped layers 12b of the first active region 12. Tn short, not only the n-type doped layers 12a of the first active region 12 but also the undoped layers 12b thereof function as a carrier flow region. Since the impurity concentration in each of the undoped layers 12b is low, impurity scattering is reduced in the undoped layer 12b. This retains a low resistance, while achieving low power consumption and large electric current. If a reverse bias is applied to the Schottky diode 20, on the other hand, a depletion layer expands from the undoped layers 12b of the first active region 12 to the n-type doped layers 12a thereof so that the entire first active region 12 is depleted easily and a high breakdown voltage is obtained. Accordingly, a power diode with low ON-state resistance, high power, and a high breakdown voltage can be implemented. By forming the power diode in a lateral configuration, the power diode can be integrated particularly easily in the common SiC substrate in conduction with a power MOSFET and the like.

When the pMOSFET 30 is in an inverted state in which carriers flow with the application of a driving voltage to the gate electrode 32, holes gather at a valence band edge that has been bent upward by the potential eV corresponding to the applied voltage V, so that the holes flow in the portion of the first active region 12 serving as a channel layer in response to the potential difference between the source region 33a and the drain region 33b. Since carriers (which are holes herein) are distributed at a concentration which is highest immediately below the gate insulating film 31 and gradually lowers in the downward direction, it follows therefore that the undoped layer 12b which is the region immediately below the gate insulating film 31 actually occupies the majority of the channel layer. However, since the undoped layer 12b has not substantially been doped with an impurity, scattering of carriers flowing in the undoped layer 12b by impurity ions is reduced. In other words, scattering of carriers by impurity ions which interrupts the flow of carriers in the first active region 12 is reduced so that a high channel mobility is achieved.

Since the gate insulating film of a MOSFET is in most cases an oxide film formed by thermally processing a substrate, positive charges trapped in the gate insulating film 31 formed by thermally oxidizing the undoped layer 12b are small in number. Moreover, holes flowing particularly in the uppermost undoped layer 12b of the first active region 12 hardly undergo a flow interrupting action resulting from the interaction between the charges in the gate insulating film 31 and themselves. This also contributes to an increase in channel mobility. When the driving voltage is not applied to the gate electrode 32, even if a high voltage is applied between the source region 33a and the drain region 33b, the depletion layer expands easily from the undoped layer 12b to the n-type doped layer 12a similarly to the case of the Schottky diode 20 so that a high breakdown voltage is obtained.

As a result, the excellent characteristics of a low ON-state resistance with a high breakdown voltage, a large current capacitance, and a high transconductance are achieved. Even if a drain voltage is, e.g., 400 V or higher, a stable drain current is obtained without a breakdown and a dielectric breakdown voltage in the MOSFET in the OFF state is 600 V or more.

In the case where the nMOSFET 40 is provided, electrons flowing in the channel region also hardly undergo an interrupting action by scattering impurity ions in the channel region or by negative charges trapped in the impurity in the gate insulating film, similarly to the pMOSFET, so that the characteristics of a low ON-state resistance with a high breakdown voltage, a large current capacitance, and a high transconductance are achieved.

Figure 3A:
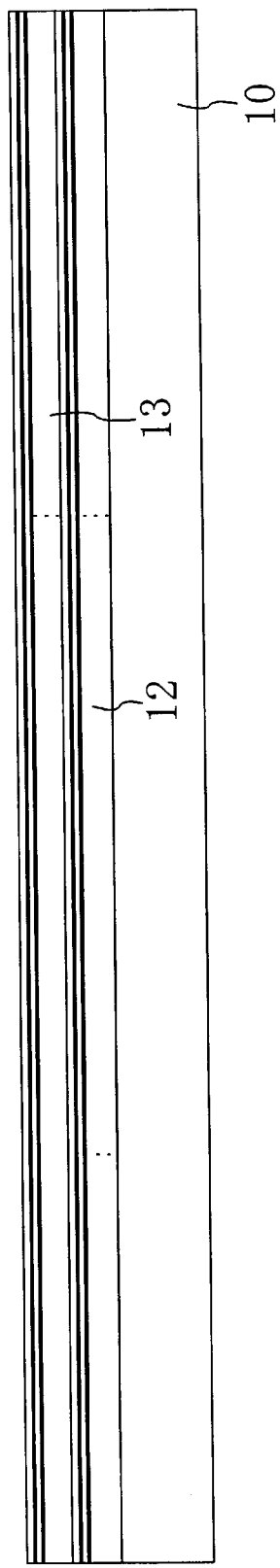
FIGS. 3A, 3B, and 3C are cross-sectional views illustrating the process steps of fabricating the semiconductor device according to the first embodiment from the formation of first and second active regions to the formation of isolation regions.
Figure 3B:
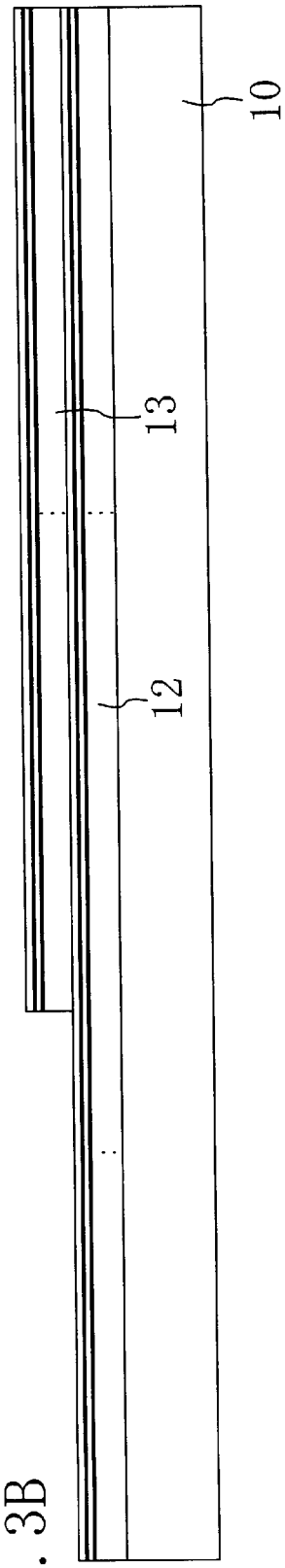
Figure 3C:
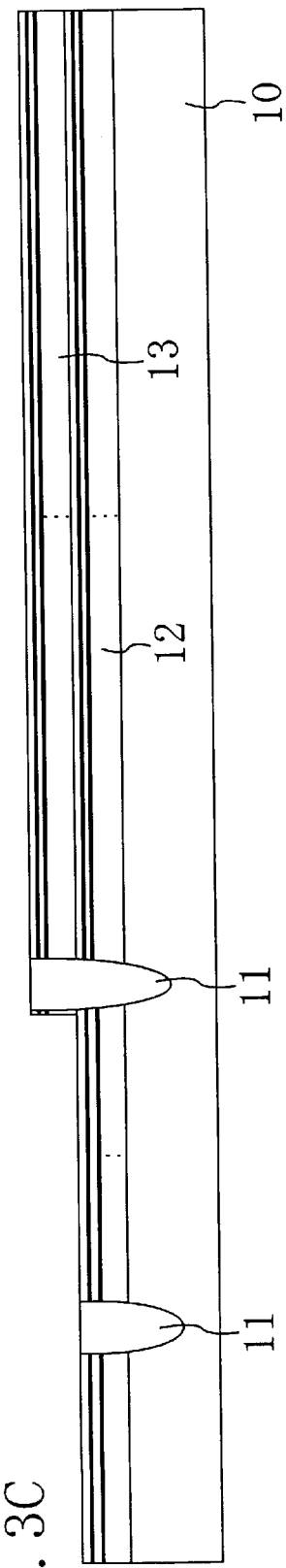
Figure 5A:
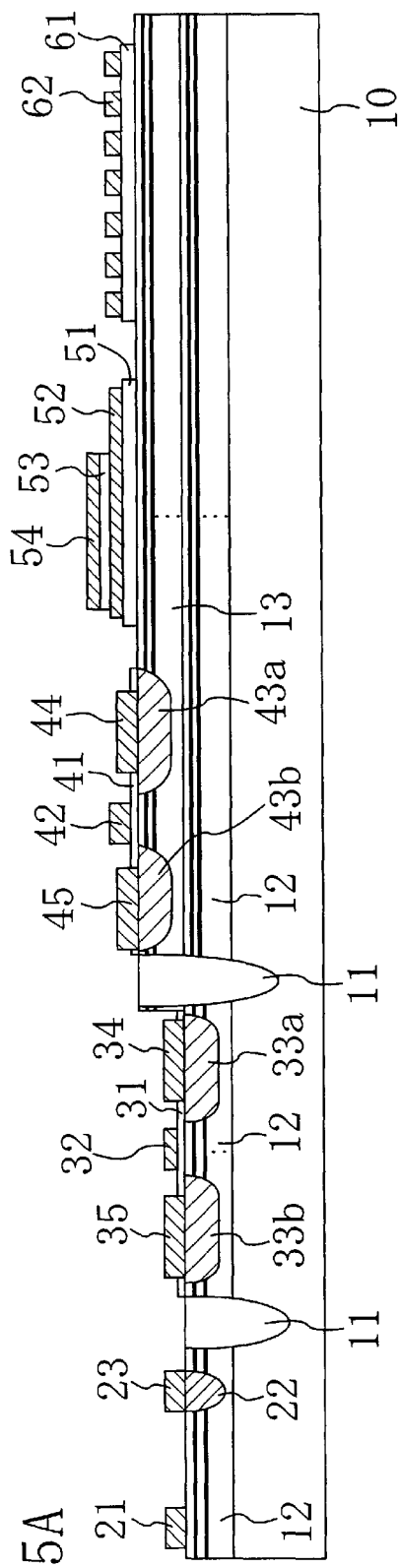
FIGS. 5A and 5B are cross-sectional views illustrating the process steps of fabricating the semiconductor device according to the first embodiment from the formation of the upper electrodes of capacitors to the formation of contact holes connecting to the respective conductor portions of the elements.
Figure 5B:
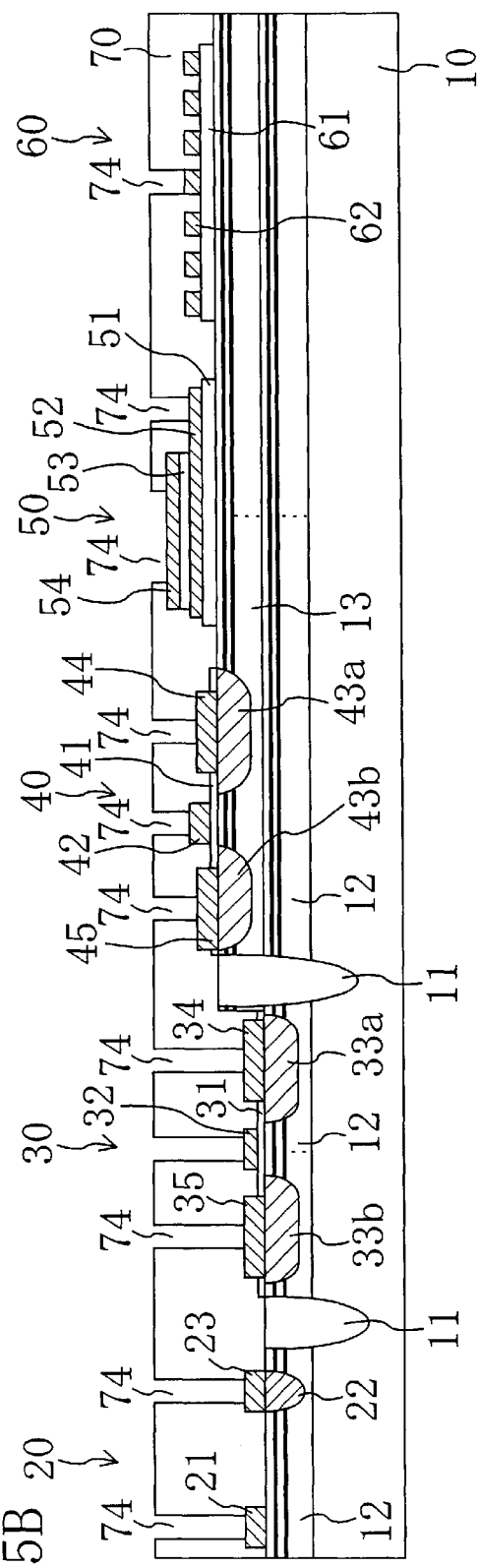

Referring to FIGS. 3A, 3B, 3C, 4A, 4B, 4C, 5A, and 5B, the process of fabricating the semiconductor device according to the present embodiment will be described. FIGS. 3A, 3B, and 3C are cross-sectional views illustrating the process steps of fabricating the semiconductor device according to the present embodiment from the formation of the first and second active regions to the formation of the isolation regions. FIGS. 4A, 4B, and 4C are cross-sectional views illustrating the process steps of fabricating the semiconductor device according to the present embodiment from the formation of the source/drain regions to the formation of the electrode or conductor film of each of elements. FIGS. 5A and 5B are cross-sectional views illustrating the process steps of fabricating the semiconductor device according to the present embodiment from the formation of the upper electrodes of capacitors to the formation of contact holes connecting to the respective conductor portions of the elements.

First, in the step shown in FIG. 4A, the p-type SiC substrate 10 is prepared. In the present embodiment, a 4H—SiC substrate having a principal surface in orientation coincident with the {11-20} plane (A plane) is used as the SiC substrate 10. It is also possible to use a SiC substrate having a principal surface in orientation several degrees deviated from the (0001) plane (C plane).

In a water vapor atmosphere bubbled with oxygen at a flow rate of 5 (1/min), the SiC substrate 10 is thermally oxidized at 1100° C. for about 3 hours such that a thermal oxide film with a thickness of about 40 nm is formed on a surface of the SiC substrate 10. Then, the thermal oxide film is removed in a buffered fluoric acid (fluoric acid:aqueous ammonium fluoride solution=1:7). The SiC substrate 10 is placed in the chamber of a CVD apparatus and the pressure in the chamber is reduced to reach a vacuum degree of about $10^{-6}$ Pa ($\approx 10^{-8}$ Torr). Then, a hydrogen gas at a flow rate of 2 (1/min) and an argon gas at a flow rate of 1 (1/min) are supplied as diluent gases into the chamber, the pressure in the chamber is adjusted to 0.0933 MPa, and the substrate temperature is adjusted to about 1600° C. As raw-material gases, a propane gas at a flow rate of 2 (ml/min) and a silane gas at a flow rate of 3 (ml/min) are introduced into the chamber, while the respective flow rates of the hydrogen gas and the argon gas are held at the foregoing constant values. The raw-material gases have been diluted with a hydrogen gas at a flow rate of 50 (ml/min). In the chamber, nitrogen (doping gas) as an n-type impurity is supplied pulsatingly, while the raw-material gases and the diluent gases are supplied, so that the n-type doped layer 12a (heavily doped layer) with a thickness of about 10 nm is formed on the principal surface of the SiC substrate 10. As a doping gas, e.g., nitrogen is contained in a high-pressure bottle and a pulse valve is provided between the high-pressure bottle and a pipe for supplying the doping gas. The doping gas can be supplied pulsatingly to a space immediately above the SiC substrate 10 in the chamber by repeatedly opening and closing the pulse valve, while supplying the raw-material gases and the diluent gases.

When the epitaxial growth of the n-type doped layer 12a is completed, the propane gas and the silane gas are supplied to the space above the SiC substrate 10 while halting the supply of the doping gas, i.e., with the pulse valve closed completely, whereby the undoped layer 12b (lightly doped layer) composed of an undoped SiC single crystal and having a thickness of about 50 nm is grown epitaxially over the principal surface of the SiC substrate 10.

Each of the step of forming the n-type doped layer 12a by introducing the doping gas through the opening and closing of the pulse valve, while simultaneously supplying the raw-material gases, and the step of forming the undoped layer 12b by supplying only the raw-material gases without supplying the doping gas, while holding the pulse valve closed, is repeated twenty times, whereby the first active region 12 composed of the twenty n-type doped layers 12a and the twenty undoped layers 12b which are alternately stacked is formed. At this time, the undoped layer 12b is formed as the uppermost layer and the thickness of the uppermost undoped layer 12b is adjusted to be larger by about 15 nm than those of the other undoped layers 12b. An average concentration of nitrogen in the first active region 12 is about $1 \times 10^{17}$ atoms $cm^{-3}$ and the total thickness of the first active region 12 after the completion of thermal oxidation is about 1100 nm.

Next, the doping gas is switched to a gas (doping gas) containing aluminum as a p-type impurity, while the raw-material gases and the diluent gases are supplied continuously, whereby the p-type doped layer 13a (heavily doped layer) with a thickness of about 10 nm is formed on the first active region 12. It is preferable to continue the supply of the raw material gases and the diluent gases for a while after the formation of the first active region 12 to form a relatively thick undoped layer on the first and active region 12 and then form the p-type doped layer 13a. As the doping gas, e.g., a hydrogen gas containing about 10% of trimethyl aluminum ($Al(CH_3)_3$) is used. Then, each of the step of forming the p-type doped layer 13a by introducing the doping gas (hydrogen gas containing trimethyl aluminum) through the opening and closing of the pulse valve, while simultaneously supplying the raw material gases, and the step of forming the undoped layer 13b by supplying only the raw material gases without supplying the doping gas, while holding the pulse valve closed, is repeated twenty times, similarly to the foregoing procedure for forming the first active region 12, whereby the second active region 13 composed of the twenty p-type doped layers 13a and the twenty undoped layers 13b which are alternately stacked is formed. At that time, the undoped layer 13b is formed as the uppermost layer and the thickness of the uppermost undoped layer 13b is adjusted to be larger by about 15 nm than those of the other undoped layers 13b. An average concentration of aluminum in the second active region 13 is about $1 \times 10^{17}$ atoms $cm^{-3}$ and the total thickness of the second active region 13 after the completion of thermal oxidation is about 1100 nm.

Next, in the step shown in FIG. 3B, the portion of the second active region 13 in which the Schottky diode 20 and the pMOSFET 30 are to be formed is removed by selective etching so that the first active region 12 is exposed in the region in which the Schottky diode 20 and the pMOSFET 30 are to be formed.

Next, in the step shown in FIG. 3C, trenches for forming the isolation regions are formed in the substrate and a silicon dioxide film is buried in each of the trenches to form the isolation regions 11.

Next, in the step shown in FIG. 4A, the electrode withdrawn layer 22 for the Schottky diode 20 and the source and drain regions 33a and 33b of the pMOSFET 30 are formed by implanting a p-type impurity (e.g., aluminum ions $Al^+$). At this time, an implant mask composed of a silicon dioxide film or the like which covers the region other than the regions in which the p-type impurity ions are to be implanted and has openings corresponding to the regions in which the p-type impurity ions are to be implanted is formed on the substrate. Then, the substrate is heated to a temperature of 500 to 800° C. and aluminum ions ($Al^+$) or the like are implanted from above the implant mask. Further, annealing for activating the impurity is performed at 1500° C. for 10 minutes, whereby the electrode withdrawn layer 22 containing the p-type impurity at a concentration of about $1 \times 10^{18}$ atoms $cm^{-3}$ is formed. At this time, aluminum ions ($Al^+$) are implanted into the substrate in, e.g., six steps of ion implantation using different implant energies. For example, the first ion implantation is performed with an acceleration voltage of 180 keV and at a dose of $1.5 \times 10^{14}$ atoms $cm^{-2}$, the second ion implantation is performed with an acceleration voltage of 130 keV and at a dose of 1×10$^{14}$ atoms cm$^{-2}$, the third ion implantation is performed with an acceleration voltage of 110 keV and at a dose of 5×10$^{13}$ atoms cm$^{-2}$, the fourth ion implantation is performed with an acceleration voltage of 100 keV and at a dose of 8×10$^{13}$ atoms cm$^{-2}$, the fifth ion implantation is performed with an acceleration voltage of 60 keV and at a dose of 6×10$^{13}$ atoms cm$^{-2}$, and the sixth ion implantation is performed with an acceleration voltage of 30 keV and at a dose of 5×10$^{13}$ atoms cm$^{-2}$. In any of the six ion implantations, the direction in which ions are implanted is 7° tilted from a normal to the SiC substrate 10 and the implant depth is about 0.3 μm.

Likewise, the source and drain regions 43*a* and 43*b* of the nMOSFET 40 are formed by implanting an n-type impurity (e.g., nitrogen ions N$^+$). At this time, an implant mask composed of a silicon dioxide film or the like which covers the region other than the regions in which the n-type impurity ions are to be implanted and has openings corresponding to the regions in which the n-type impurity ions are to be implanted is formed on the substrate. Then, the substrate is heated to a temperature of 500 to 800° C. and nitrogen ions (N$^+$) or the like are implanted from above the implant mask. Further, annealing for activating the impurity is performed at 1500° C. for 10 minutes, whereby the source and drain regions 43*a* and 43*b* each at an implant depth of about 0.8 μm and containing the n-type impurity at a concentration of about 1×10$^{18}$ atoms cm$^{-3}$ are formed.

Next, in the step shown in FIG. 4B, the implanted mask is removed and then a SiN film with a thickness of about 0.4 μm is formed by plasma CVD on the substrate and patterned to form the underlying insulating film 51 and the dielectric film 61 on the respective regions of the second active region 13 on which the capacitor 50 and the inductor 60 are to be formed.

Next, in the step shown in FIG. 4C, respective surface portions (each corresponding to a thickness of about 15 nm) of the uppermost undoped layers 12*b* and 13*b* of the first and second active regions 12 and 13 are thermally oxidized at a temperature of about 1100° C. in the region to be formed with the MOSFET, thereby forming the gate insulating films 31 and 41 each composed of a thermal oxide film with a thickness of about 30 nm. Then, openings are formed by removing the portions of the gate insulating films 31 and 41 located above the source and drain regions 33*a* and 33*b* such that the source electrodes 34 and 44 and drain electrodes 35 and 45 each composed of a Ni alloy film formed by vacuum vapor deposition are formed in the openings. At the same time, the ohmic electrode 23 composed of the Ni alloy film is formed also on the electrode withdrawn layer 22 of the Schottky diode 20. Further, annealing is performed at 1000° C. for 3 minutes to provide ohmic contact between the source electrodes 34 and 44, the drain electrodes 35 and 45, and the ohmic electrode 23 and the active regions 12 and 13 or the electrode withdrawn layer 22. Subsequently, a titanium (Ti) alloy film is vapor-deposited on each of the gate insulating films 31 and 41 so that the gate electrodes 32 and 42 each composed of the titanium alloy film and having a gate length of about 1 μm are formed. On the other hand, nickel (Ni) is vapor-deposited on the region of the first active region 12 on which the Schottky diode 20 is to be formed so that the Schottky electrode 21 composed of nickel is formed, while platinum (Pt) is vapor-deposited on the underlying insulating film 51 of the capacitor 50 such that the lower electrode 52 composed of platinum is formed.

Next, a resist film having a spiral opening is formed on the region on which the inductor 60 is to be formed. A Cu film with a thickness of about 4 μm is deposited on the resist film and lifted off, whereby the spiral conductor film 62 is left on the dielectric film 61. It is also possible to compose the conductor film of an aluminum alloy film instead of the Cu film. In that case, the aluminum alloy film is deposited and patterned by RIE dry etching using a Cl$_2$ gas and a BCl$_3$ gas, thereby forming the spiral conductor film 62.

Next, in the step shown in FIG. 5A, a BST film is formed by sputtering on the lower electrode of the capacitor 50. Then, a platinum (Pt) film is formed by vapor deposition on the BST film. The platinum film and the BST film are patterned into a specified configuration to form the upper electrode 54 and the capacitor insulating film 53.

Next, the interlayer insulating film 70 composed of a silicon dioxide film is deposited on the substrate. The interlayer insulating film 70 is formed with contact holes 74 reaching the Schottky electrode 21 of the Schottky diode 20, the ohmic electrode 23, the source and drain electrodes 34 and 35 of the pMOSFET 30, the source and drain electrodes 44 and 45 of the nMOSFET 40, the upper and lower electrodes 54 and 52 of the capacitor 50, and the center portion of the spiral conductor film 62 of the inductor 60.

Thereafter, an aluminum alloy film is formed in each of the contact holes 72 and on the interlayer insulating film 70 and patterned to provide the structure of the semiconductor device shown in FIG. 1.

Although the present embodiment has used the SiC layer, the present embodiment is applicable not only to a semiconductor device provided on the SiC layer but also to all semiconductor devices provided on a compound semiconductor substrate composed of a compound of a plurality of elements such as a GaAs layer, a GaN layer, an AlGaAs layer, a SiGe layer, a SiGeC layer, an InP layer, an InGaAs layer, or an InGaPN layer. In that case also, the provision of the active region formed by stacking the δ-doped layers and the lightly doped layers (including undoped layers) under the gate insulating film allows improvements in channel mobility and breakdown voltage by using reduced scattering by impurity ions, depletion of the whole channel region in the OFF state, trapping of charges in the impurity in the δ-doped layers. In the case of using the SiC layer, the InP layer, the InGaAs layer, the InGaPN layer, or the GaN layer, a device with particularly high channel mobility is obtainable.

Embodiment 2

A description will be given next to a second embodiment of the present invention, which is an exemplary application of the semiconductor device described in the first embodiment to a lamp lighting circuit.

Figure 6:
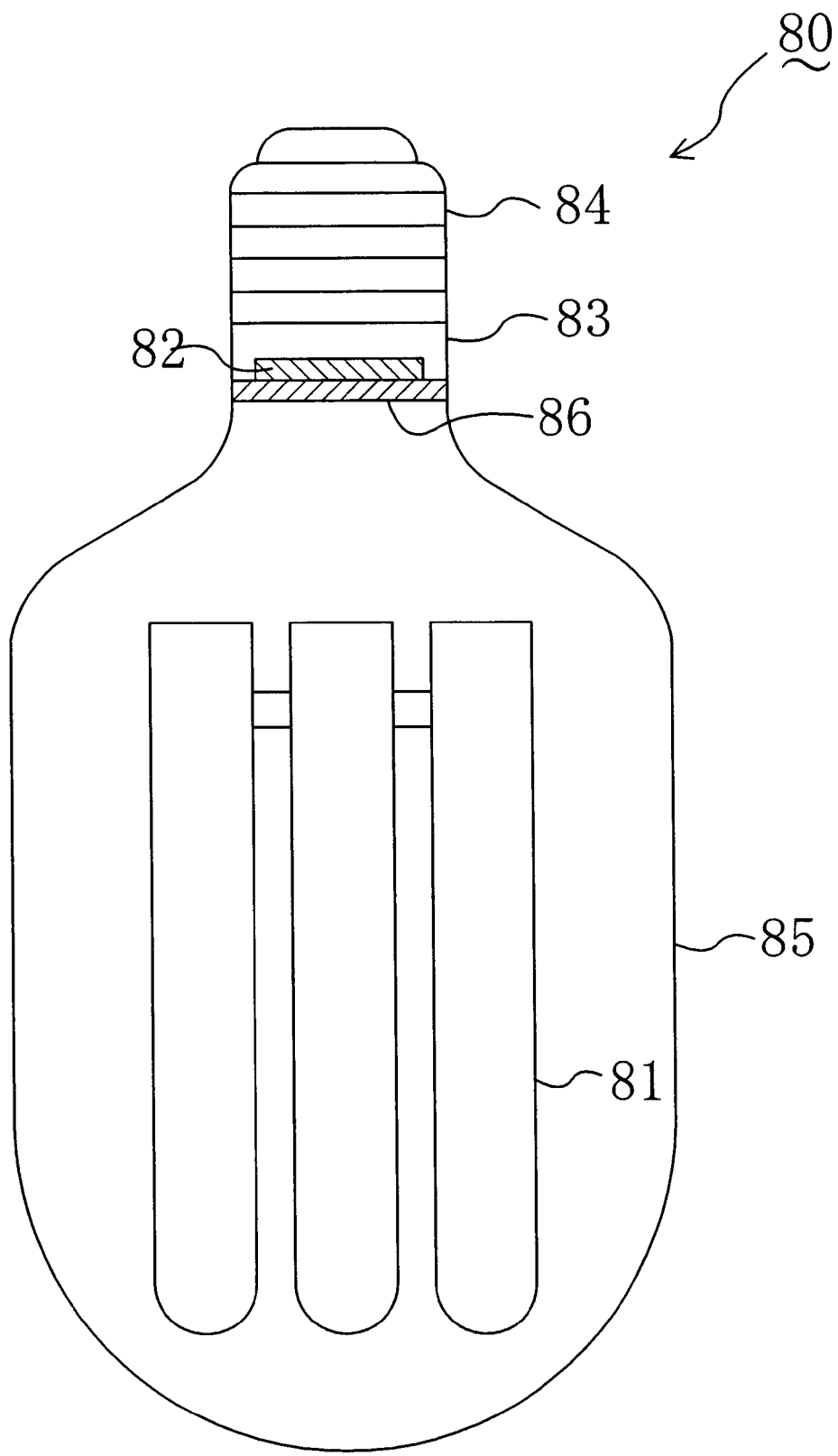
FIG. 6 is a cross-sectional view showing a structure of a fluorescent lamp device according to a second embodiment of the present invention.

FIG. 6 is a cross-sectional view showing a structure of a fluorescent bulb lamp device 80 according to the present embodiment. As shown in the drawing, the fluorescent lamp device 80 comprises: a fluorescent lamp 81 composed of three luminescent tubes each having a generally U-shaped configuration which are coupled to each other; a lighting circuit 82 including such an element as a semiconductor chip for lighting the fluorescent lamp 81; a cover 83 for containing the lighting circuit 82; a mouth ring 84 attached to a tip of the cover 83; a globe 85 enveloping the fluorescent lamp 81; and a circuit board 86 for carrying the lighting circuit 82.

Figure 7:
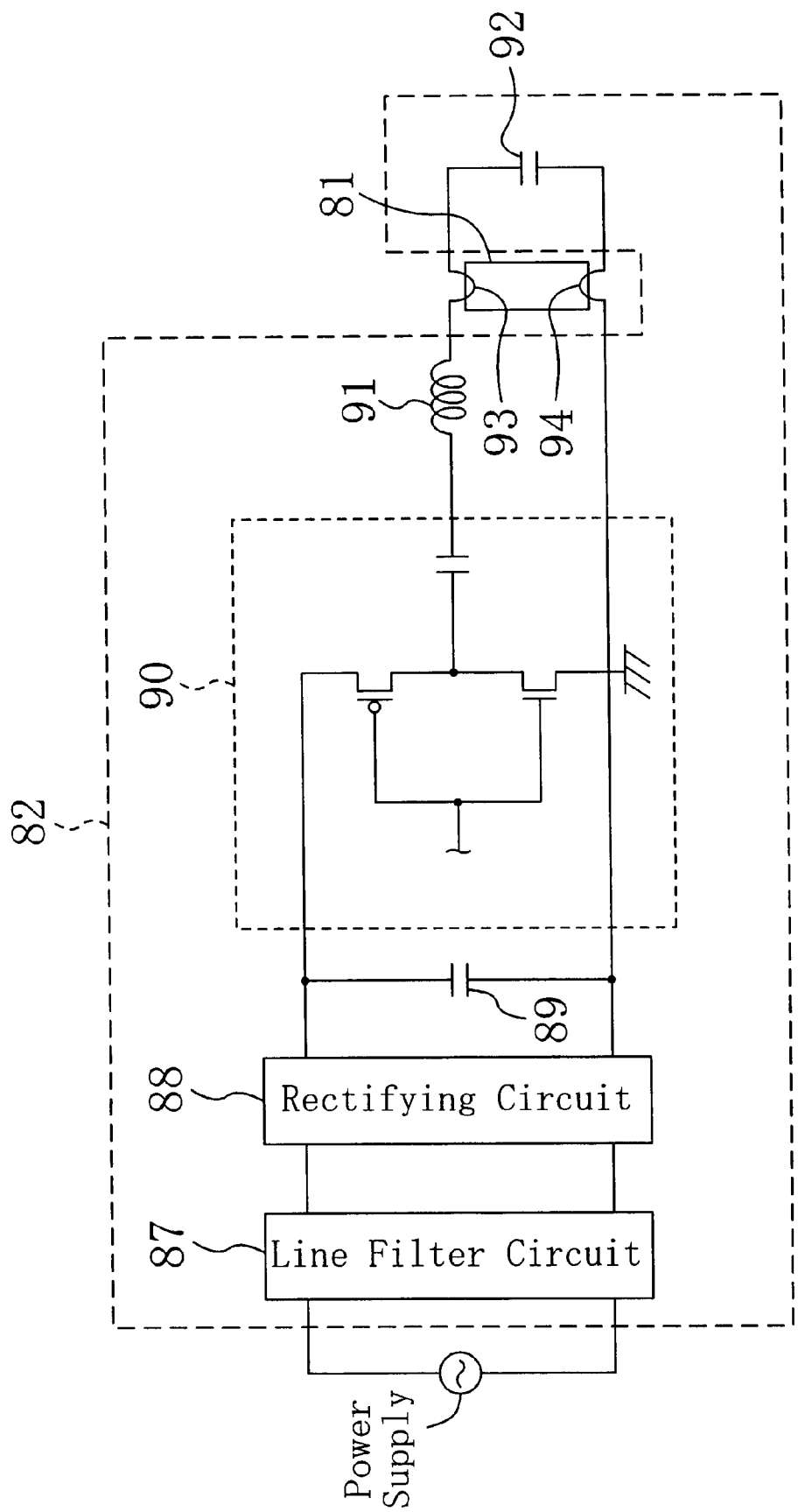
FIG. 7 is an electric circuit diagram showing a configuration of a lighting circuit in the fluorescent lamp device according to the second embodiment.

FIG. 7 is an electric circuit diagram showing a structure of the lighting circuit 82 in the fluorescent lamp device 80. As shown in the drawing, the lighting circuit 82 is composed of a line filter circuit 87, a rectifying circuit 88, a power-supply smoothing capacitor 89, an inverter circuit 90, an inductor 91, and a resonating capacitor 92 which are disposed in the lighting circuit 82. The inverter circuit 90 is composed of a pMOSFET, an nMOSFET, and a capacitor for inverter. The fluorescent lamp 81 is disposed in parallel with the resonating capacitor 92 such that fluorescent light is emitted therefrom by allowing a discharge current to flow between electrodes 93 and 94 at both ends in the fluorescent lamp 81.

The fluorescent lamp device 80 according to the present invention is characterized in that the individual members in the lighting circuit 82 are mounted in the single SiC substrate, as shown in FIG. 6, which scales down the whole lighting circuit 82. As will be described later, the lighting circuit 82 according to the present embodiment can be scaled down to occupy an area which is, e.g., about 10 to 15 mm square. In addition, the whole lighting circuit 82 has a thickness which is as small as the sum of the thickness of the SiC substrate and the respective thicknesses of multilayer films and interlayer insulating films so that the whole lighting circuit 82 has an extremely low-profile structure. This allows the lighting circuit 82 to be placed at a portion with a small diameter in the vicinity of the mouth ring 84 and reduces the size of the lamp. In particular, the provision of the MOSFET and the Schottky diode in the common SiC substrate, which is enabled by forming each of the active elements including the MOSFET and the Schottky diode in a lateral configuration as described above in the first embodiment, allows easier integration. Since the passive elements including the inductor can be mounted in the common SiC substrate, further scaling down is achievable.

Figure 8:
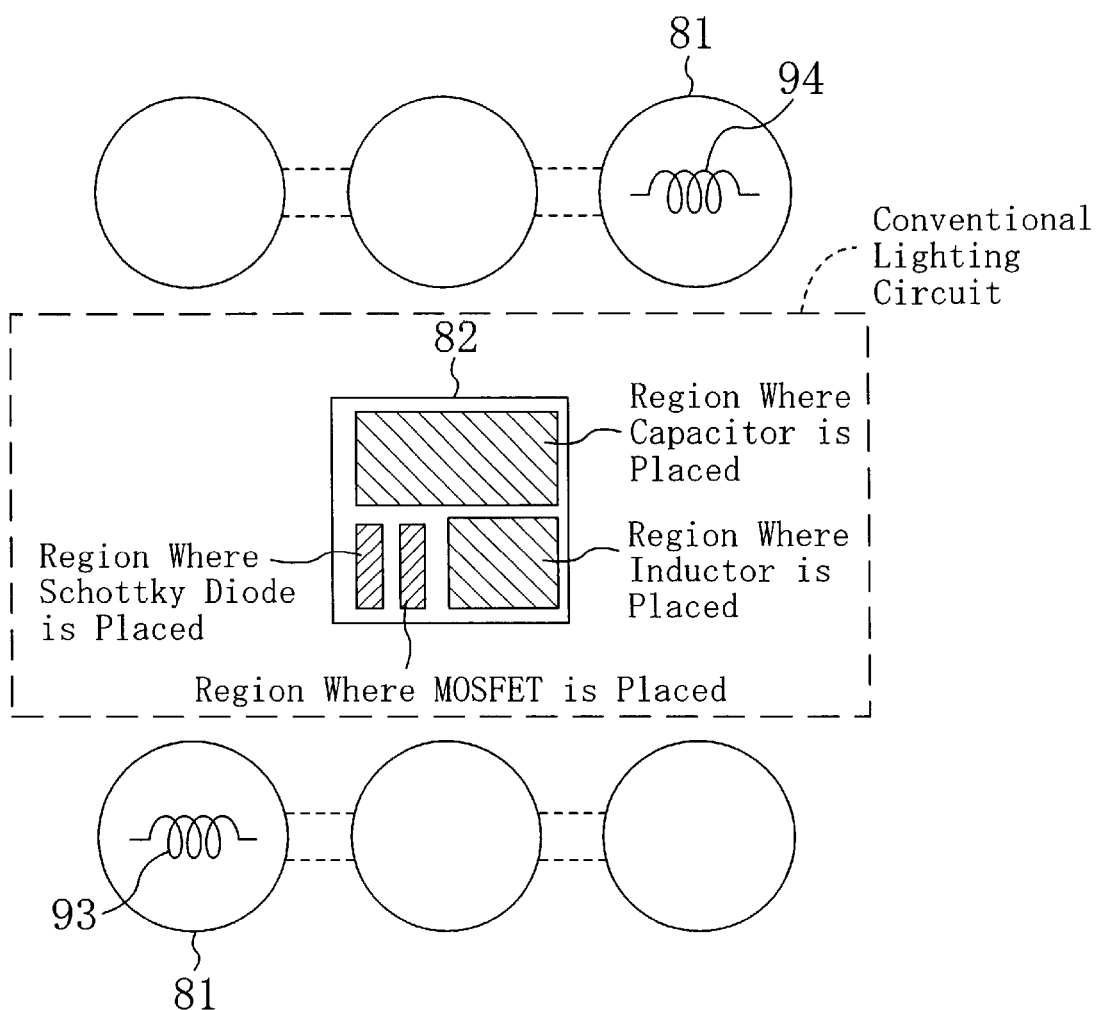
FIG. 8 shows for comparison the size of the lighting circuit according to the second embodiment and the size of a conventional lighting circuit.

FIG. 8 shows for comparison the size of the lighting circuit 82 according to the present embodiment and the size of the conventional lighting circuit (enclosed in the broken rectangle) disclosed in the foregoing publication. The present embodiment can achieve a reduction in the space occupied by the individual members as follows.

Since the MOSFET has a gate length of 1 $\mu$m, the area occupied by the inverter can be held within an area of about several tens to several hundreds of micrometers. The rectifying circuit composed of the four Schottky diodes can also be held within an equal area or less.

If a conductor film having a spiral configuration with a line width of 9 $\mu$m is provided with a 4-$\mu$m spacing in an area of about 5 mm square, the inductor has about 160 turns and an inductance of 780 $\mu$H. Since the inductance of an inductor used in the lighting circuit of a fluorescent lamp device is normally on the order of 400 to 700 $\mu$H, an inductor satisfying the specifications can be provided if an area of about 5 mm square is available.

If the BST film is formed to occupy an area of, e.g., 5 mm square, the capacitor (condenser) provides a capacitance of about 22 $\mu$F. since the BST film has a relative dielectric constant of about 1000 and the thickness thereof can be reduced to about 10 nm. The capacitance of a capacitor used in the lighting circuit of a fluorescent lamp device is normally on the order of 20 to 30 $\mu$F. A capacitor placed in another circuit does not need so large an area since a sufficient capacitance therefor is on the nanofarad order. This provides a SiC substrate having an area of 10 to 20 mm square with a region in which the capacitors of the whole lighting circuit are placed.

Since a temperature range which ensures normal operation of the MOSFET and the Schottky diode formed on the SiC substrate is around 400° C., various constraints resulting from a low upper-limit temperature of 150° C. as placed in the case where a conventional FET provided on a Si substrate is assumedly used are eased considerably. In the conventional fluorescent lamp device, e.g., the temperature increased by heat generated from the choke coil exceeds 150° C. If consideration is given to heat dissipated from the lamp, the FET in the inverter circuit and the diode in the rectifying circuit should be positioned in spaced apart relation from the choke coil. In the present embodiment, however, even if all the elements are positioned in close proximity, problems associated with heat resistance seldom arise because the MOSFET and Schottky diode on the SiC substrate are high in heat resistance. Since the lighting circuit can be scaled down significantly, placement flexibility in the lamp is held high. Since the SiC substrate has a high heat conductivity and an excellent heat releasing property, the elements within the lighting circuit 82 can easily be prevented from being adversely affected by heat dissipation from the fluorescent lamp 81.

In the lighting circuit 82 according to the present embodiment, some of the inductors and capacitors may also be placed at the back surface of the SiC substrate so that the area of the substrate is used effectively. It is also possible to form a structure in which the whole chip of the SiC substrate is buried in glass such as quartz glass to be placed in a bulb.

Although the second embodiment has described an example in which the semiconductor device using the SiC substrate is disposed in the lighting circuit of the lamp, it will easily be appreciated that the semiconductor device according to the present invention can be used also for other equipment. In such equipment as an air conditioner, a vacuum cleaner, a laundry washer, or a refrigerator also, the semiconductor device according to the present invention is disposed appropriately to achieve the foregoing effects described in the foregoing embodiment if the equipment is used at high temperatures or required to contain a control circuit within a limited space. Equipment which is particularly small in size and generates a large amount of heat, such as the lighting circuit of a lamp, is required to have high heat resistance and compactness so that it achieves prominent effects if the present invention is applied thereto.

Although each of the foregoing embodiments has used the SiC layer, the same effects as described above are achievable if a substrate composed of a semi-insulating layer other than the SiC layer such as a GaAs layer, a GaN layer, an AlGaAs layer, a SiGe layer, a SiGeC layer, an InP layer, or an InGaPN layer is used. If the InP substrate or the InGaPN substrate is used, a transistor operating at a particularly high speed is obtainable.

Although each of the foregoing embodiments has provided the diode and MOSFET each having a lateral configuration as active elements, the active elements according to the present invention are not limited to the embodiments and are applicable even to a diode and a power MOSFET each having a vertical configuration. An active element having a vertical configuration and an active element having a lateral configuration may be provided on a common substrate such as a SiC substrate or a plurality of active elements each having a vertical configuration may be provided on a common substrate such as a SiC substrate.

A description will be given herein below to data on the diode and MOSFET used in each of the foregoing embodiments, which was obtained through actual measurement.

Figure 9:
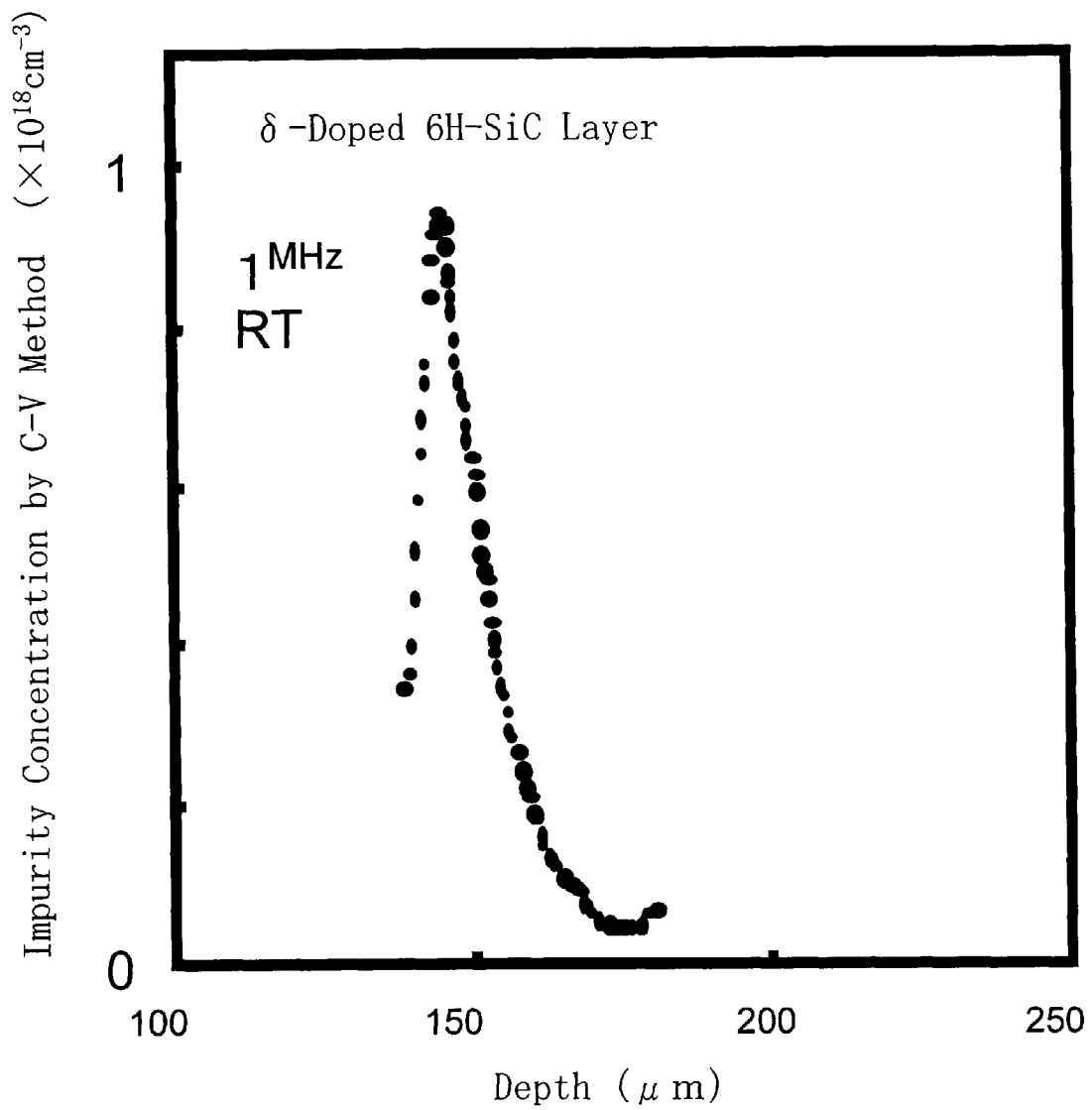
FIG. 9 shows the result of measuring an impurity concentration in the Schottky diode according to the first embodiment by a C-V method.

FIG. 9 shows the result of measuring an impurity concentration in a Schottky diode by a C-V method, which was conducted to closely examine the profile of a $\delta$-doped layer when the concentration of nitrogen was $1\times10^{18}$ atoms cm$^{-3}$. The measurement in accordance with the C-V method was conducted by varying a bias from 0.5 V to $-0.2$ V and from $-0.2$ V to $-2$ V and applying, to the Schottky diode having a circular Ni Schottky electrode with a diameter of 300 $\mu$m, an RF signal having an extremely small amplitude of 1

MHz, which is superimposed on the varied bias. The profile of the impurity concentration shown in the drawing was obtained from a δ-doped layer extracted from a multilayer structure composed of δ-doped layers each having a thickness of 10 nm and undoped layers each having a thickness of 50 nm. As shown in the drawing, the impurity concentration is nearly vertically symmetrical along the depth, which indicates that a doping memory effect (residual effect of a dopant) during epitaxial growth by CVD can be ignored in accordance with the epitaxial method according to the embodiment of the present invention. A two-dimensional carrier concentration in the δ-doped layer measured by the C-V method is $1.5 \times 10^{12}$ cm$^{-2}$, which is in relatively close agreement with a two-dimensional carrier concentration of about $2.5 \times 10^{12}$ cm$^{-2}$ obtained by measuring a hole coefficient. The pulsating profile is formed to have a half-value width of 12 nm and remarkable sharpness.

Figure 10:
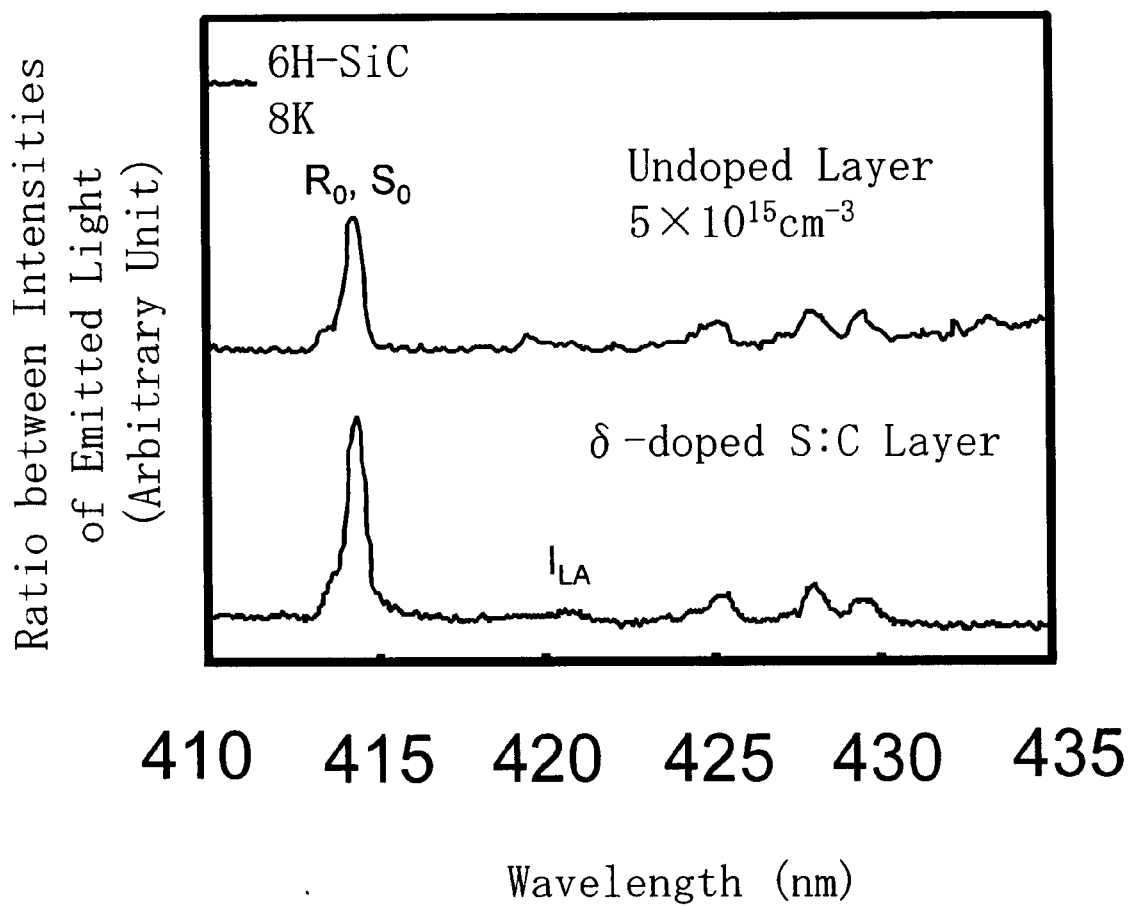
FIG. 10 shows the result of measuring a band-edge photoluminescent spectrum for a δ-doped layer in a 6H—SiC substrate according to the first embodiment.

FIG. 10 shows the result of measuring a band-edge photoluminescent spectrum obtained from a δ-doped layer in a 6H—SiC substrate. The spectrum was obtained at a temperature of 8K by using a He—Cd laser with an intensity of 0.5 mW as an exciting source. Here, a comparison is made between a spectrum obtained from an undoped layer of a multilayer structure composed of δ-doped layers each having a thickness of 10 nm and undoped layers each having a thickness of 50 nm and a spectrum obtained from an undoped layer having a thickness of 1 μm. As shown in the drawing, since the two spectral patterns have emission peaks of the same intensity in the same wavelength region, it will be understood that the two undoped layers have the same impurity concentration. In other words, it will be understood that the undoped layer of the multilayer structure composed of the δ-doped layers and the undoped layers barely shows an increase in impurity concentration due to the diffusion of an impurity from the δ-doped layers and that the multilayer structure is formed, while retaining a nearly desired impurity concentration profile. It is to be specially noted that the impurity concentration in the undoped layer has been adjusted to a low value of about $5 \times 10^{16}$ atoms cm$^{-3}$. By using a PL method, it was proved that the impurity concentration in the undoped layer of the active region obtained by alternately stacking the δ-doped layers and the undoped layers according to the present invention was as low as about $5 \times 10^{16}$ atoms cm$^{-3}$.

Figure 11A:
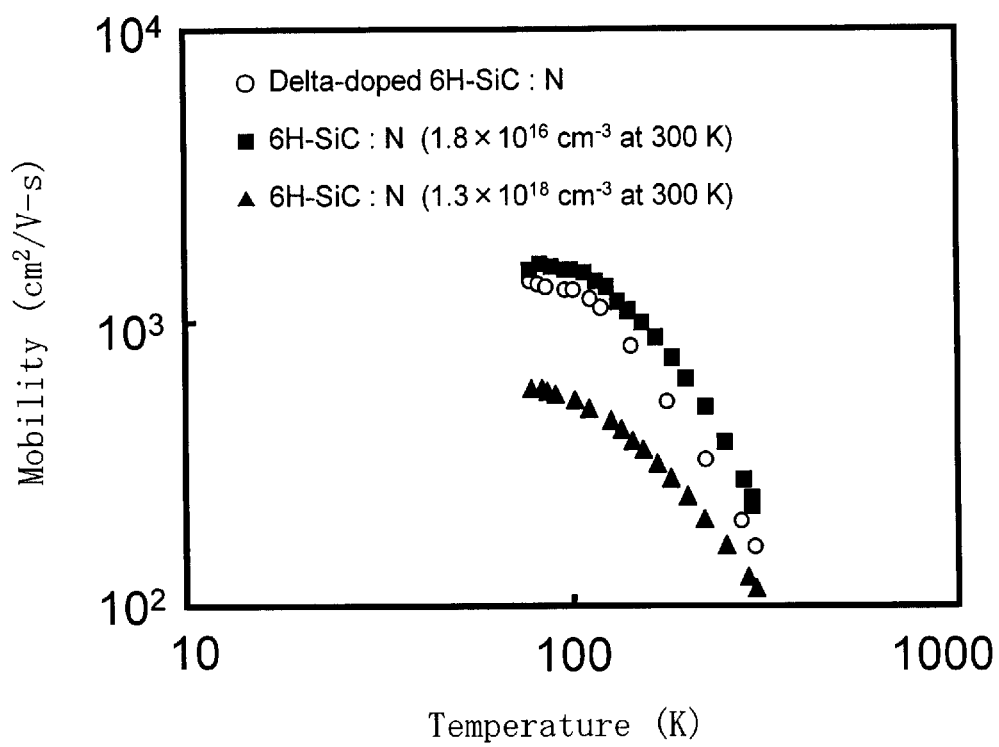
FIGS. 11A and 11B show data indicative of the dependence of electron mobility on temperature and the dependence of electron concentration on temperature each in a 6H—SiC substrate according to the first embodiment.
Figure 11B:
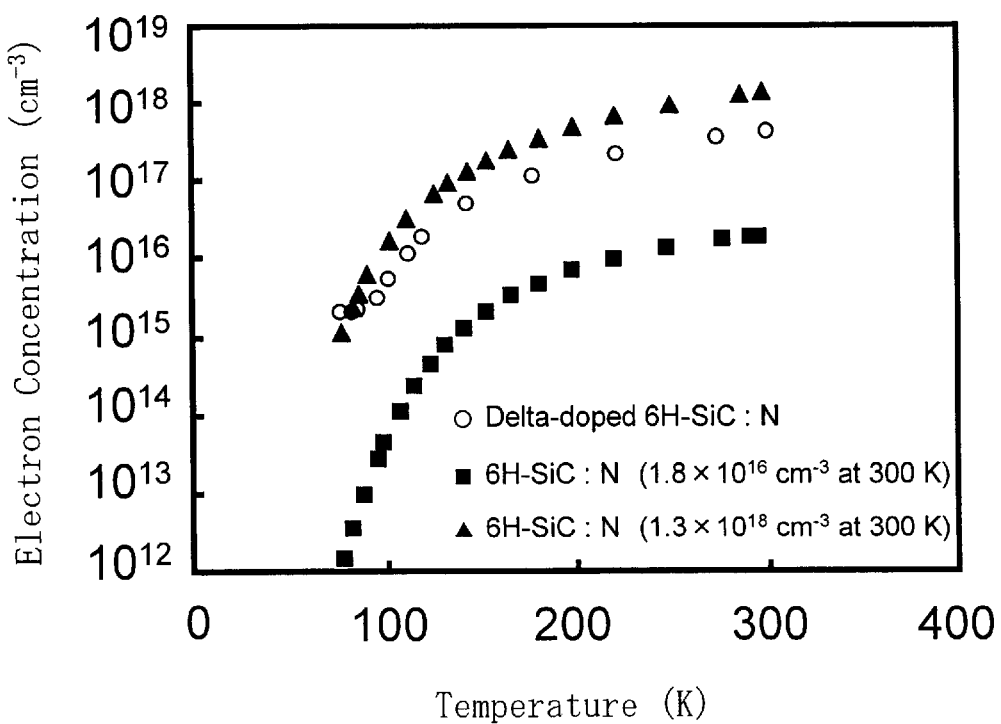

FIGS. 11A and 11B show data indicative of the dependence of electron mobility on temperature and the dependence of electron concentration on temperature in the 6H—SiC layer. In FIGS. 11A and 11B, the symbol ○ shows data on a 6H—SiC layer (sample A) formed by stacking δ-doped layers (containing nitrogen as a dopant) each having a thickness of 10 nm and undoped layers each having a thickness of 50 nm, the symbol ■ shows data on a lightly uniformly doped 6H—SiC layer ($1.8 \times 10^{16}$ cm$^{-3}$), and the symbol ▲ shows data on a heavily uniformly doped 6H—SiC layer ($1.3 \times 10^{18}$ cm$^{-3}$).

As shown in FIGS. 11A and 11B, the impurity concentration is low in the lightly uniformly doped 6H—SiC layer ($1.8 \times 10^{16}$ cm$^{-3}$) so that scattering of flowing carriers by the impurity is reduced and therefore the mobility of an electron is high. On the other hand, the impurity concentration is high in the heavily uniformly doped 6H—SiC layer ($1.3 \times 10^{18}$ cm$^{-3}$) so that scattering of flowing carriers by the impurity is increased and therefore the mobility of an electron is low. In short, the relationship between carrier concentration and the flowing property of a carrier is a trade-off. By contrast, the electron concentration in the δ-doped layer of the active region of the sample A is as high as in the heavily uniformly doped layer and the mobility of an electron in the δ-doped layer is also high. This indicates that the active region according to the present invention has a structure suitable for use in the region of a diode or a transistor in which electrons flow since the active region has a high electron mobility as well as a high electron concentration. Even if the carriers are holes, the situation is principally the same as in the case where the carriers are electrons. Accordingly, it can be considered that a high hole mobility is achievable, while the hole concentration in the p-type δ-doped layer is increased.

Figure 12:
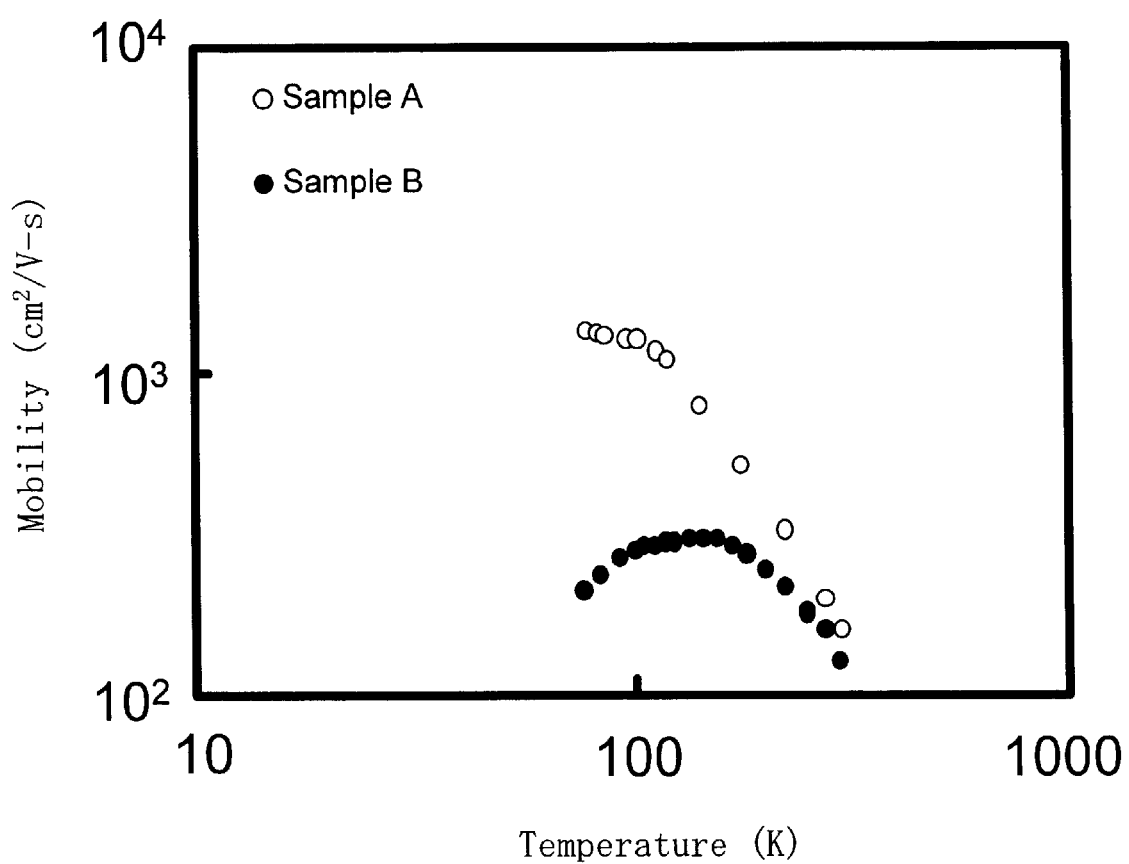
FIG. 12 shows data indicative of the dependence of electron mobility on temperature in each of samples A and B according to the first embodiment.

FIG. 12 shows data indicative of the dependence of electron mobility on temperature in each of the sample A having the foregoing active region composed of the δ-doped layers each having a thickness of 10 nm and the undoped layers each having a thickness of 50 nm and a sample B having an active region composed of δ-doped layers each having a thickness of 20 nm and undoped layers each having a thickness of 100 nm. The data on the electron mobility was obtained through measurement conducted at a temperature range of 77 to 300 K. As shown in the drawing, the electron mobility in the sample A is higher than the electron mobility in the sample B irrespective of respective average impurity concentrations in the samples A and B that have been equalized by adjusting the ratio between the thicknesses of the δ-doped layer and the undoped layer to 1:5 in each of the samples A and B, as described above. In a lower-temperature region, in particular, the electron mobility in the sample B is reduced by the scattering of carriers by the ionized impurity as the temperature decreases. By contrast, the sample A retains a high electron mobility even at low temperatures.

Figure 13A:
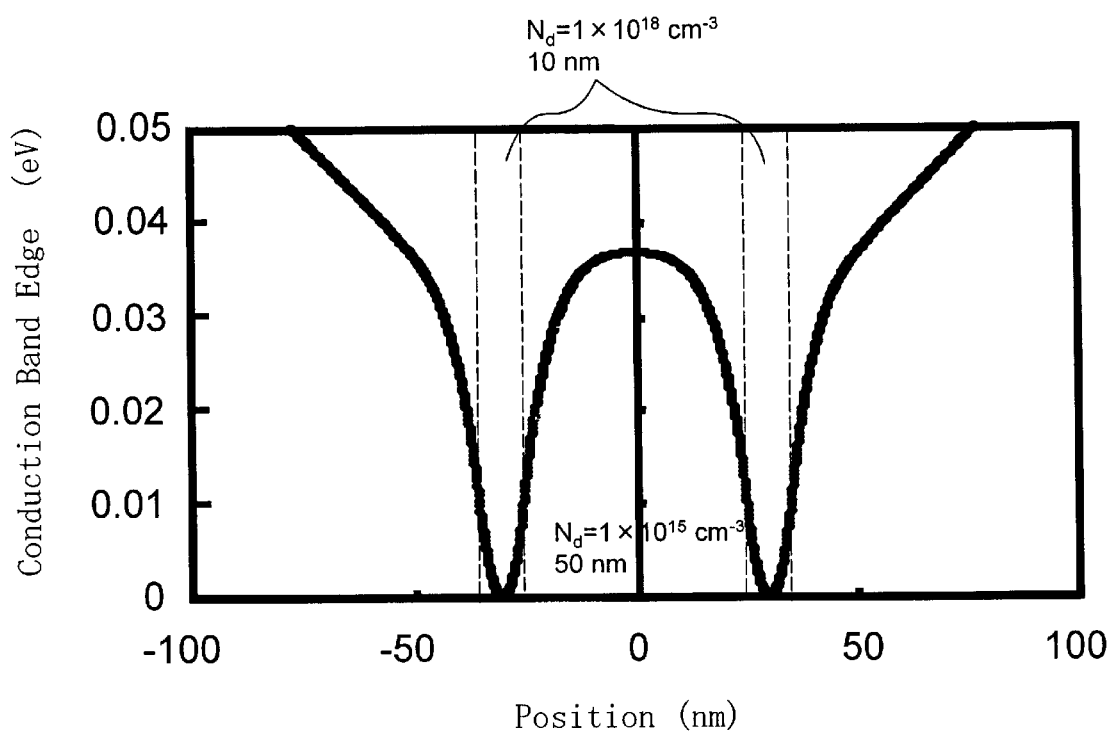
FIGS. 13A and 13B show the result of simulating a band structure at a conduction band edge and a distribution of carrier concentration each in the sample A according to the first embodiment.
Figure 13B:
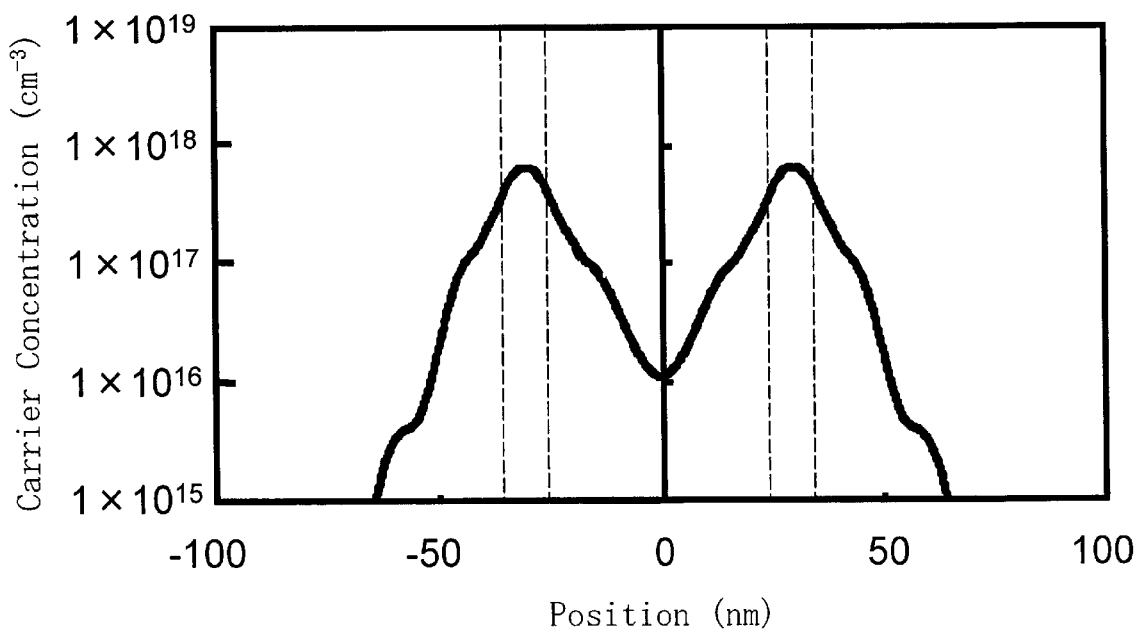
Figure 14A:
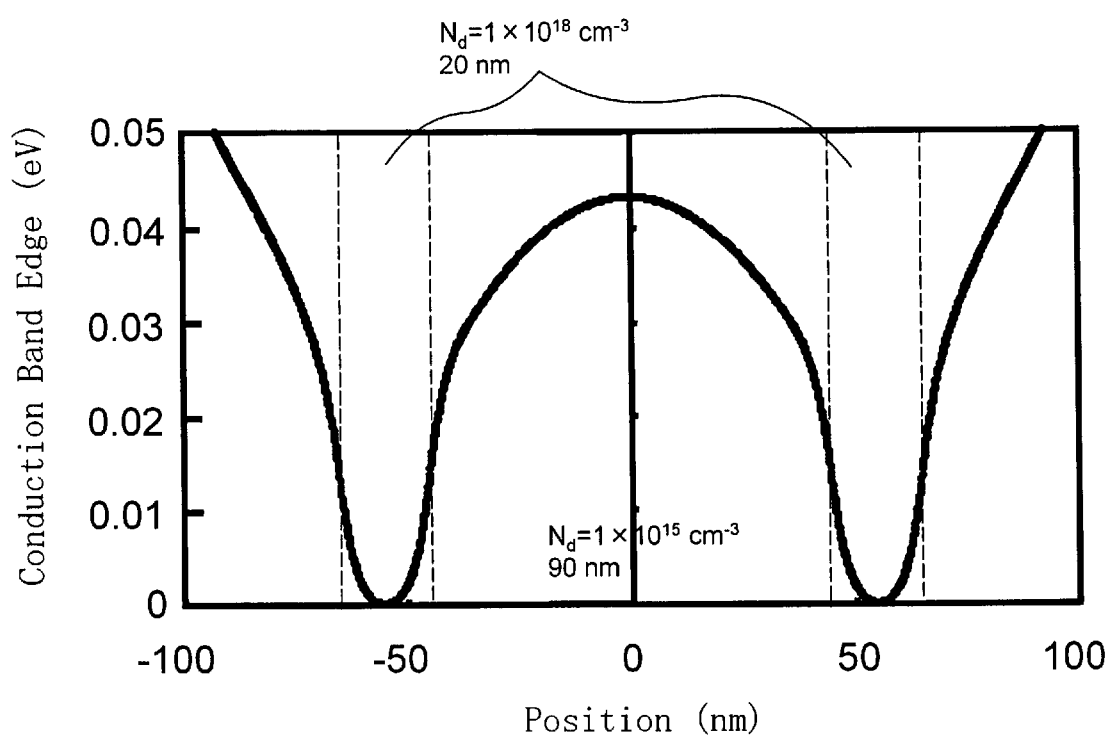
FIGS. 14A and 14B show the result of simulating a band structure at a conduction band edge and a distribution of carrier concentration each in the sample B according to the first embodiment.
Figure 14B:
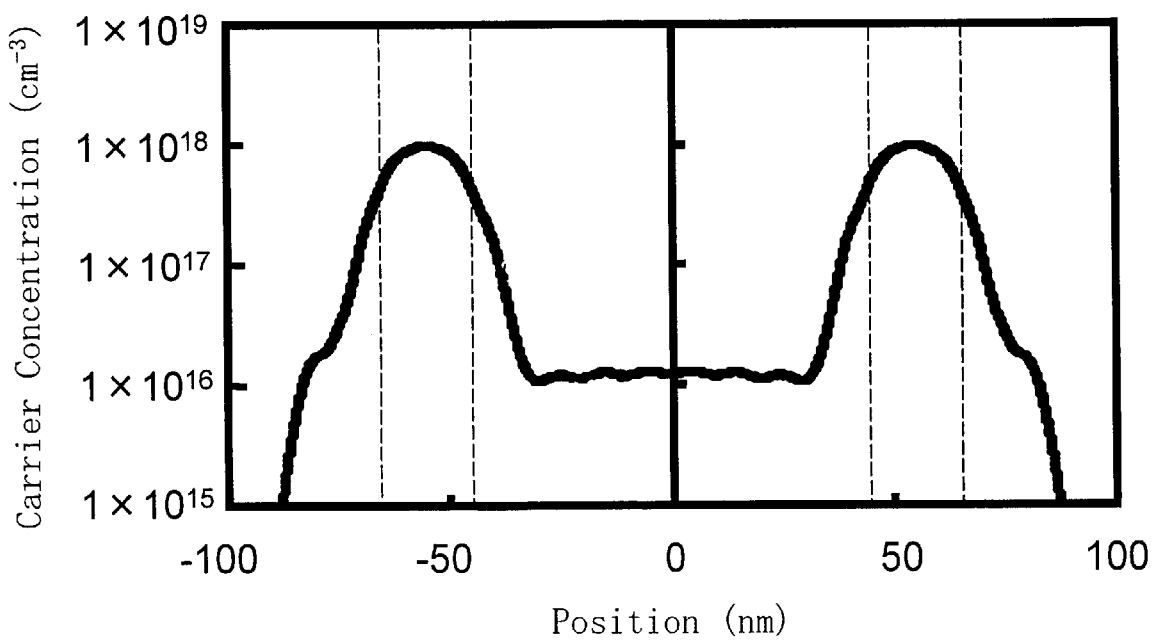

FIGS. 13A and 13B show the result of simulating a band structure at a conduction band edge and a distribution of carrier concentration in the sample A having the δ-doped layers each having a thickness of 10 nm. FIGS. 14A and 14B show the result of simulating a band structure at a conduction band edge and a distribution of carrier concentration in the sample B having the δ-doped layers each having a thickness of 20 nm. As shown in FIG. 13A and FIG. 14A, electrons are confined to a V-shaped Coulomb potential (quantum well) composed of positively charge donor layers in a cross section orthogonally intersecting the δ-doped layers and a quantum state is formed within the well. The effective mass of an electron is 1.1 and the relative dielectric constant of the 6H—SiC layer is 9.66. A background carrier concentration in the 6H—SiC layer used as the undoped layer is $1 \times 10^{15}$ cm$^{-3}$ and a carrier concentration in the n-type δ-doped layer is $1 \times 10^{18}$ cm$^{-3}$.

As shown in FIG. 13B, two-dimensional electrons are distributed extensively even in the undoped layer sandwiched between the two δ-doped layers (sample A) each having a thickness of 10 nm and the region where an electron concentration is $2 \times 10^{16}$ cm$^{-3}$ or more is observed in the range at 25 nm from the interface. This indicates that carriers have spread out from the n-type doped layer 12$a$ (δ-doped layer) to the undoped layer 12$b$ shown in FIG. 1.

On the other hand, a large overlapping portion exists between a region where the probability of presence of a carrier defined by the wave function of an electron is high and the δ-doped layer having the center of ionized impurity scattering in the δ-doped layer (sample B) having a large thickness of 20 nm so that the region where an electron concentration is $2 \times 10^{16}$ cm$^{-3}$ or more is at 11 nm from the interface, as shown in FIG. 14B. This indicates that a relatively small number of carriers have spread out from the δ-doped layers to the undoped layers.

Judging from the foregoing embodiments and the simulation data, a preferred thickness range for the heavily doped layer is from 1 monolayer inclusive to 20 nm exclusive when the SiC layer is used. On the other hand, a preferred thickness range for the lightly doped layer (including the undoped layer) is from about 10 nm inclusive to about 100 nm inclusive. The respective thicknesses of the heavily doped layer and the lightly doped layer can be determined properly in accordance with the type and object of active elements (such as a diode and a transistor) formed by using the heavily doped layer and the lightly doped layer.

Embodiment 3

In a third embodiment of the present invention, an ACCUFET (Accumulated Mode FET) using a multilayer structure composed of δ-doped layers and undoped layers to function as a large-current switching transistor will be used instead of the MOSFET of the integrated semiconductor device used in the first embodiment.

Figure 15:
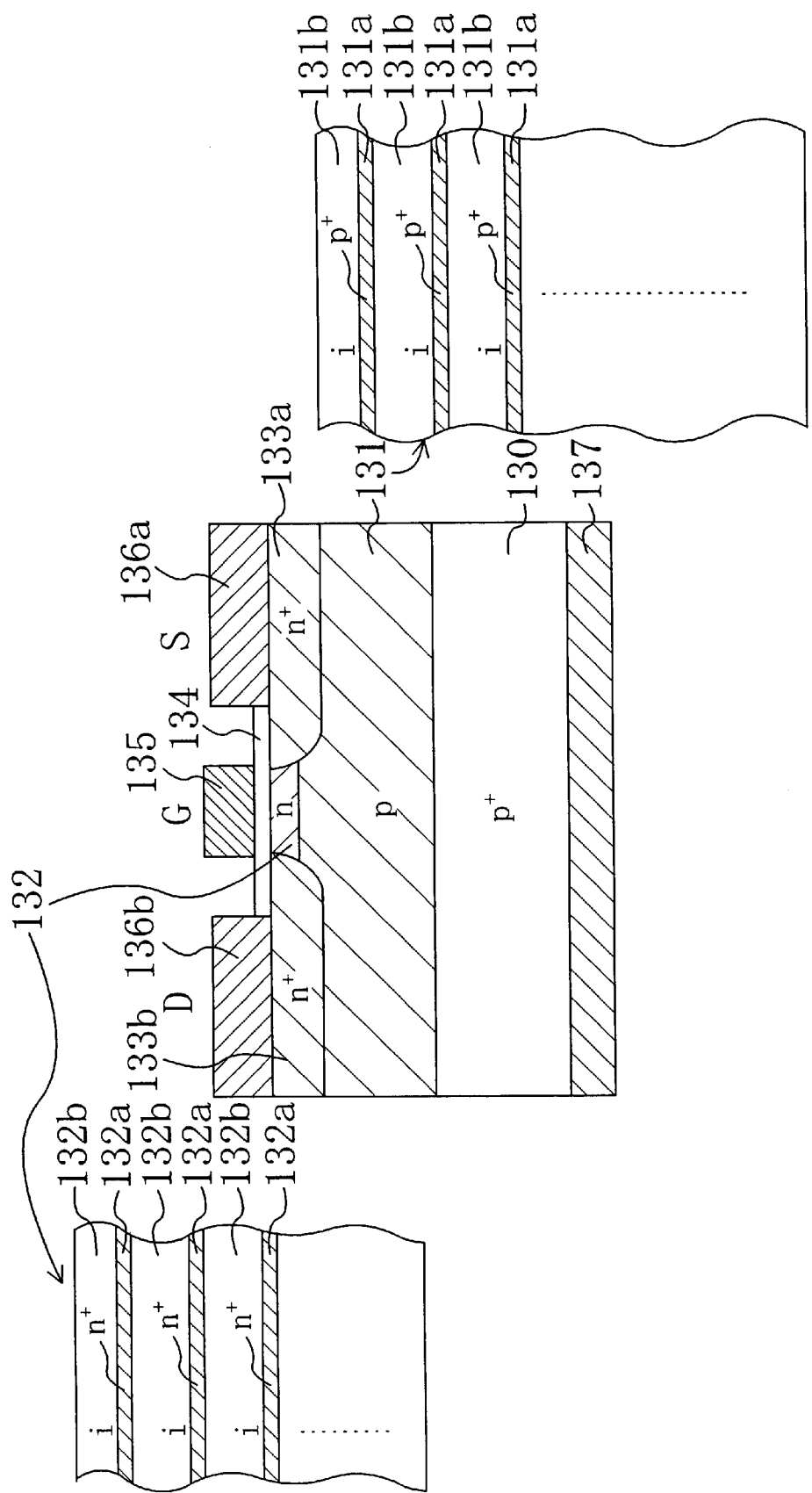
FIG. 15 is a cross-sectional view of an ACCUFET according to the second embodiment.

FIG. 15 is a cross-sectional view showing a structure of only the ACCUFET portion according to the present embodiment. As shown in the drawing, a lower active region 131 doped with aluminum at an average concentration of about $1 \times 10^{17}$ atoms cm$^{-3}$, an upper active region 132 formed on the lower active region 131 and doped with nitrogen at an average concentration of about $1 \times 10^{17}$ atoms cm$^{-3}$, n-type source and drain regions 133$a$ and 133$b$ formed by implanting nitrogen at a concentration of $1 \times 10^{18}$ atoms cm$^{-3}$ in the upper and lower active regions 132 and 131, respectively, a gate insulating film 134 composed of SiO$_2$ formed on the upper active region 132, a gate electrode 135 composed of a Ni alloy film formed on the gate insulating film 134, source and drain electrodes 136$a$ and 136$b$ composed of a Ni alloy film in ohmic contact with the source and drain regions 133$a$ and 133$b$, respectively, and a back-surface electrode 137 composed of a Ni alloy film in ohmic contact with the back surface of a SiC substrate 130 are provided on the SiC substrate 130 doped with aluminum (p-type impurity) at a concentration of $1 \times 10^{18}$ atoms cm$^{-3}$.

As shown in the right-hand part of FIG. 15 under magnification, the lower active region 131 consists of about forty p-type doped layers 131$a$ each containing aluminum at a high concentration (e.g., $1 \times 10^{18}$ atoms cm$^{-3}$) and having a thickness of about 10 nm and about forty undoped layers 131$b$ each composed of an undoped SiC single crystal and having a thickness of about 50 nm, which are alternately stacked. The lower active region 131 has a total thickness of about 2400 nm. Each of the p-type doped layers 131$a$ is formed sufficiently thin to allow spreading movement of carriers to the undoped layers 131$b$ under a quantum effect so that negative charges are trapped in the p-type doped layers 131$a$ with the spreading out of the carriers.

As shown in the left-hand part of FIG. 15 under magnification, the upper active region 132 consists of five n-type doped layers 132$a$ each containing nitrogen at a high concentration (e.g., $1 \times 10^{18}$ atoms cm$^{-3}$) and having a thickness of about 10 nm and five undoped layers 132$b$ each composed of an undoped SiC single crystal and having a thickness of about 50 nm, which are alternately stacked. Therefore, the upper active region 132 has a total thickness of about 300 nm. Under a quantum effect, a quantum level is produced in the n-type doped layer 132$a$ so that the wave function of an electron which is present locally in the n-type doped layer 132$a$ expands to a certain degree. What results is the aforesaid state of distribution in which electrons are present not only in the n-type doped layers 132$a$ but also in the undoped layers 132$b$. In the state, the potential of the upper active region 132 is increased and electrons spread from the n-type doped layers 132$a$ to the undoped layers 132$b$ under a quantum effect so that electrons are constantly supplied to the n-type doped layers 132$a$ and to the undoped layers 132$b$. Since electrons flow in the undoped layers 132$b$ at a low impurity concentration, a high channel mobility is achieved. In the OFF state, on the other hand, the entire upper active region 132 is depleted and an electron no more exists in the upper active region 132 so that the breakdown voltage is defined by the undoped layer 132$b$ at a low impurity concentration. This provides the whole upper active region 132 with a high breakdown voltage. In the ACCUFET constructed to allow a large current to flow between the source and drain regions 133$a$ and 133$b$ by using the upper active region 132, therefore, a high channel mobility and a high breakdown voltage can be achieved simultaneously.

Since an impurity concentration in the undoped layer 132$b$ is low as stated previously, the use of the upper active region 132 as the channel layer increases channel mobility by reducing the charges trapped in the gate insulating film 134 and in the vicinity of the interface between the gate insulating film 134 and the upper active region 132, while increasing channel mobility and breakdown voltage by reducing scattering of carriers by impurity ions.

The use of the ACCUFET according to the present embodiment instead of the MOSFET according to the first embodiment allows the construction of a semiconductor device suited to a lamp device which requires a larger power.

The dependence of current-voltage characteristic (relationship between a drain current and a drain voltage) on gate voltage was examined for the ACCUFET according to the present embodiment and it was found that the amount of saturation current had increased more than in the n-channel MOSFET according to the first embodiment. At a drain voltage of 400 V or more, a stable drain current was obtained without a breakdown, a dielectric breakdown voltage in the OFF state was 600 V or more, and ON-state resistance at a low value of 1 mΩ cm$^2$ was achieved.

Despite large saturation current and low ON-state resistance which characterize the ACCUFET, the ACCUFET has not been produced yet on an industrial basis. A major factor preventing the commercialization of the ACCUFET is its low OFF-state breakdown voltage. However, since the ACCUFET according to the present embodiment provides a high OFF-state breakdown voltage by using the multilayer structure composed of the δ-doped layers and the undoped layers, it may be said that considerable progress has been made toward the commercialization of the ACCUFET.

As for the process steps of fabricating an integrated semiconductor device having the ACCUFET according to the present embodiment, they are basically the same as the process steps of fabricating the integrated semiconductor device according to the first embodiment so that the description thereof is omitted.

Although the present embodiment has provided the lower active region 131 composed of the δ-doped layers and the undoped layers which are alternately stacked, the lower active region need not necessarily be provided. It is also possible to provide a lightly uniformly doped layer or an undoped layer instead of the lower active region. However, the provision of the lower active region 131 composed of the δ-doped layers and the undoped layers which are alternately stacked increases, to a higher value, the breakdown voltage in the region underlying the channel.

Figure 16:
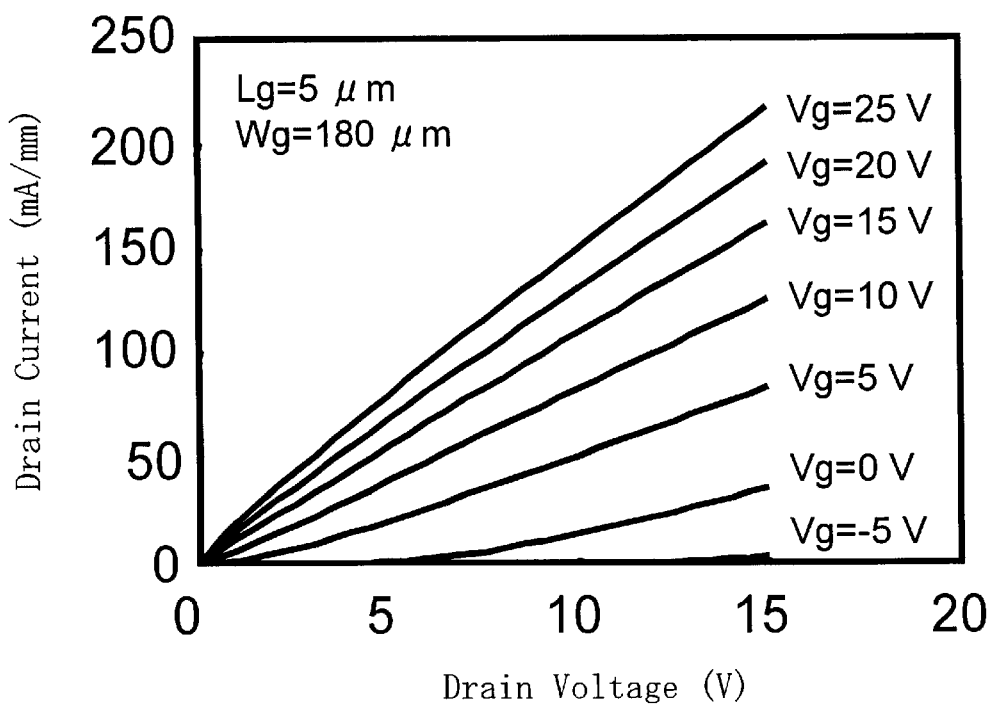
FIG. 16 shows the I-V characteristic of the ACCUFET fabricated in the second embodiment.

FIG. 16 shows the I-V characteristic (characteristic of drain current which changes in response to a change in drain voltage) when gate bias Vg is varied in increments of 5 V from −5 V to 25 V. As can be seen from the I-V characteristic, a large drain current on the order of 220 mA/mm was obtained even if gate bias was set to 15 V which is a relatively low value for a power device. In short, it was proved that the ACCUFET according to the present invention had a high current driving power.

Figure 17:
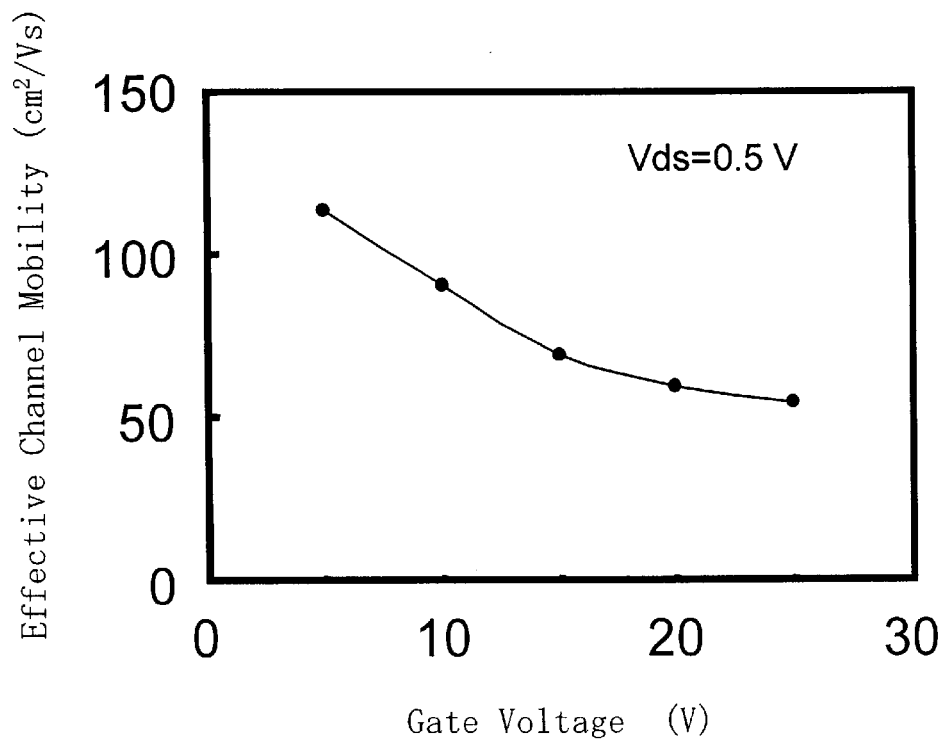
FIG. 17 shows the dependence of effective channel mobility on gate voltage obtained through calculation based on the data shown in FIG. 16.
Figure 18:
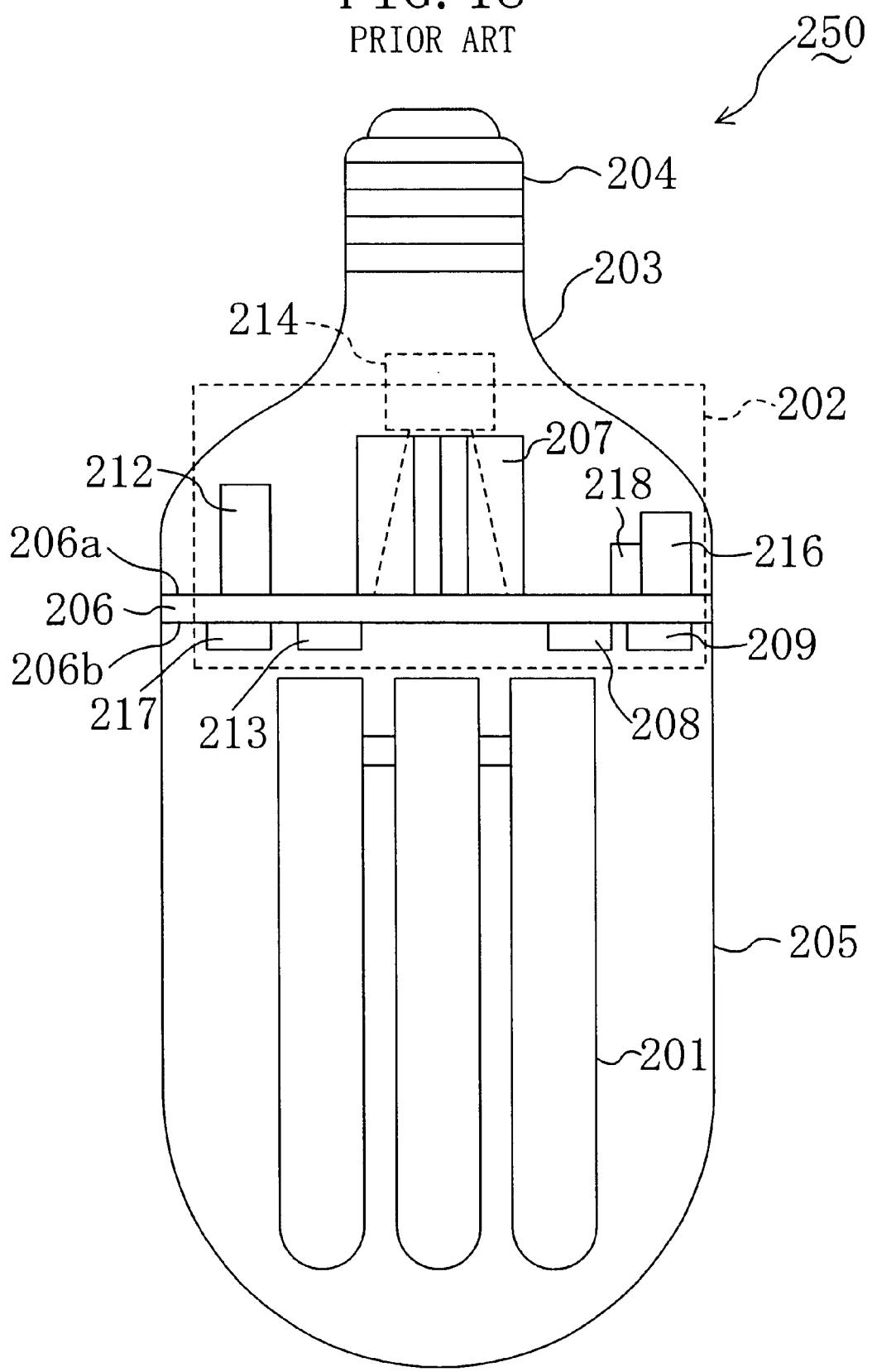
FIG. 18 is a cross-sectional view showing a structure of a conventional fluorescent lamp device.

FIG. 17 shows the dependence of effective channel mobility on gate voltage obtained through calculation based on the data shown in FIG. 16. As shown in the drawing, it was proved that the ACCUFET according to the present embodiment had an effective channel mobility of 50 (cm$^2$/Vs) or more even if gate bias was increased. It will therefore be understood that, in spite of the current driving power of a FET which is proportional to effective channel mobility, the ACCUFET according to the present embodiment having the foregoing structure composed of the δ-doped layers and the undoped layers which are alternately stacked achieves a high effective channel mobility and thereby provides a large current driving power.

Other Embodiments

A semiconductor layer other than the SiC layer may also be used. For example, an InP layer, an InGaAs layer, or an InGaPN layer on an InP substrate may be used. Alternatively, a GaN layer on a sapphire substrate, a GaN substrate, or the like may also be used. Besides, a well-known compound semiconductor layer such as a GaAs layer, an AlGaAs layer, a GaN layer, an AlGaN layer, a SiGe layer, or a SiGeC layer may also be used. In the case of using such a compound semiconductor layer, the thickness of the heavily doped layer (δ-doped layer) may be determined properly in accordance with the material thereof. In the case of using the GaAs layer, e.g., a δ-doped layer with a thickness of 1 monolayer can be provided. To increase breakdown voltage with the same thickness, the heavily doped layer (δ-doped layer) preferably has a smaller thickness so long as the carrier supplying ability is retained properly.

A description will be given particularly to the case of using the InP substrate. In this case, a semiconductor device has basically the same structure as shown in FIG. 1. By using the InGaAs layer on the InP substrate, an integrated semiconductor device can be constructed by integrating a Schottky diode, a MOSFET, a capacitor, and an inductor.

In that case, a semi-insulating InP substrate with a thickness of about 100 µm doped with iron (Fe) at a high concentration is used instead of the Si substrate 10. Instead of the first active region 12, a structure formed by alternately stacking a plurality of n-type doped layers each composed of an InGaAs single crystal (at a composition ratio of, e.g., In$_{0.53}$Ga$_{0.47}$As) containing Si (silicon) at a high concentration (e.g., 1×10$^{20}$ atoms cm$^{-3}$) and having a thickness of about 1 nm and a plurality of undoped layers each composed of an InGaAs single crystal (at a composition ratio of, e.g., In$_{0.53}$Ga$_{0.47}$As) and having a thickness of about 10 nm is used. Instead of the second active region 13, a structure formed by alternately stacking a plurality of p-type doped layers each containing Zn (Be) at a high concentration (e.g., 1×10$^{20}$ atoms cm$^{-3}$) and having a thickness of about 1 nm and a plurality of undoped layers each composed of an InAlAs single crystal (at a composition ratio of, e.g., In$_{0.52}$Al$_{0.48}$As) and having a thickness of about 10 nm is used.

It has been known that, if the InGaAs layer or the InGaPN layer formed on the InP substrate is used as en electron flow region, an extremely high electron mobility is obtained. By using the characteristic, therefore, a lighting circuit having a switching transistor operating in an extremely high frequency region (30 GHz to 60 GHz) mounted thereon is obtainable.

In the case of using the InGaAs layer on the InP substrate also, a Schottky diode, a capacitor, and an inductor can be provided, similarly to the first embodiment. If an inductor is provided, the InP substrate allows the size reduction of a conductor film composing the inductor because of its particularly high heat resistance and high heat conductivity. A smaller pattern, e.g., a configuration with a width of 1 to 2 µm and a spacing of about 1 to 2 µm can be formed.

INDUSTRIAL APPLICABILITY

A semiconductor device according to the present invention is used for a device mounted on electronic equipment, such as a MOSFET device, an ACCUFET device, or a DMOS device. In particular, the semiconductor device according to the present invention is used for a device handling an RF signal or a power device.

What is claimed is:

1. A semiconductor device, comprising:

a compound semiconductor layer made of a compound semiconductor selected from the group consisting of a SiC layer, a GaN layer, an InP layer, an InGaAs layer, and an InGaPN layer;

an inductor provided on the compound semiconductor layer;

an inverter circuit including a MISFET provided on the compound semiconductor layer;

a rectifying circuit including a Shottky diode provided on the compound semiconductor device; and a capacitor provided on the compound semiconductor layer, wherein the MISFET is composed of an active region formed on the compound semiconductor layer, a gate insulating film formed on the active region, a gate electrode formed on the gate insulating film and source and drain regions formed in a region located on both sides of the gate electrode, and the active region in a portion sandwiched between the source region and the drain region is composed of a plurality of first semiconductor layers and a plurality of second semiconductor layers containing an impurity for carriers at a high concentration and smaller in film thickness than the first semiconductor layer, the first and second semiconductor layers being alternately stacked, the device functioning as a lighting circuit for a fluorescent lamp device.

2. The semiconductor device of claim 1, wherein the plurality of first semiconductor layers function as a carrier flow region, and the carriers in the plurality of second semiconductor layers spread out the first semiconductor layer under a quantum effect, the device functioning as a lighting circuit for a fluorescent lamp device.

3. The semiconductor device of claim 1, further comprising a second active region provided on the active region and a second MISFET, wherein the second MISFET is composed of a second gate insulating film formed on the second active region, a second gate electrode formed on the second gate insulating film and second source and drain regions formed in a region located on both sides of the second gate electrode, and the second active region in a portion sandwiched between the second region and drain regions is composed of a plurality of first semiconductor layers and a plurality of second semiconductor layers containing an impurity for carriers at a high concentration and smaller in film thickness that the first semiconductor layer, the first and second semiconductor layers being alternately stacked, the device functioning as a lighting circuit for a fluorescent lamp device.

4. The semiconductor device of claim 3, wherein the MISFET is a p-type MISFET, and the second MISFET is an n-type MISFET, the device functioning as a lighting circuit for a fluorescent lamp device.

* * * * *

UNITED STATES PATENT AND TRADEMARK OFFICE
CERTIFICATE OF CORRECTION

PATENT NO. : 6,674,131 B2
DATED : January 6, 2004
INVENTOR(S) : Toshiya Yokogawa et al.

It is certified that error appears in the above-identified patent and that said Letters Patent is hereby corrected as shown below:

Column 20,
Line 57, "thickness that" should be -- thickness than --

Signed and Sealed this

Nineteenth Day of October, 2004

JON W. DUDAS
*Director of the United States Patent and Trademark Office*